(12) United States Patent
Hiew et al.

(10) Patent No.: US 8,254,134 B2
(45) Date of Patent: Aug. 28, 2012

(54) MOLDED MEMORY CARD WITH WRITE PROTECTION SWITCH ASSEMBLY

(75) Inventors: Siew S. Hiew, San Jose, CA (US);
Abraham C. Ma, Fremont, CA (US);
Nan Nan, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 420 days.

(21) Appl. No.: 12/684,841

(22) Filed: Jan. 8, 2010

(65) Prior Publication Data

US 2010/0110647 A1     May 6, 2010

Related U.S. Application Data

(63) Continuation-in-part of application No. 12/175,753, filed on Jul. 18, 2008, now abandoned, and a continuation-in-part of application No. 12/106,517, filed on Apr. 21, 2008, now abandoned, and a continuation-in-part of application No. 11/831,888, filed on Jul. 31, 2007, now Pat. No. 7,830,666, and a continuation-in-part of application No. 11/770,661, filed on Jun. 28, 2007, now Pat. No. 7,866,562, and a continuation-in-part of application No. 11/744,125, filed on May 3, 2007, now Pat. No. 7,795,714.

(51) Int. Cl.
*H05K 7/02* (2006.01)

(52) U.S. Cl. ......... 361/737; 235/492; 257/679; 439/945

(58) Field of Classification Search .................. 361/737, 361/752; 235/488, 441, 492; 29/830; 439/945, 439/946; 357/679
See application file for complete search history.

(56) References Cited

U.S. PATENT DOCUMENTS

| | | | |
|---|---|---|---|
| 5,397,857 | A | 3/1995 | Farquhar et al. |
| 5,404,485 | A | 4/1995 | Ban |
| 5,414,597 | A | 5/1995 | Lindland et al. |
| 5,430,859 | A | 7/1995 | Norman et al. |
| 5,479,638 | A | 12/1995 | Assar et al. |
| 5,530,622 | A | 6/1996 | Takiar et al. |
| 5,563,769 | A | 10/1996 | MacGregor |
| 5,623,552 | A | 4/1997 | Lane |
| 5,821,614 | A | 10/1998 | Hashimoto et al. |

(Continued)

OTHER PUBLICATIONS

USB FlashCard "Main Body Dimensions", "Top View", "Bottom View" Web pages, Lexar, 2004, 3 pages.

(Continued)

*Primary Examiner* — Dameon Levi
(74) *Attorney, Agent, or Firm* — Bever, Hoffman & Harms, LLP; Patrick T. Bever

(57) ABSTRACT

A Secure Digital device including a PCBA having passive components mounted on a PCB using surface mount technology (SMT) techniques, and active components (e.g., controller and flash memory) mounted using chip-on-board (COB) techniques. The components are mounted only on one side of the PCB, and then a molded plastic casing is formed over both sides of the PCB such that the components are encased in the plastic, and a thin plastic layer is formed over the PCB surface opposite to the components. The molded plastic casing is formed to include openings that expose metal contacts provided on the PCB, and ribs that separate the openings. The molded plastic casing defines a pre-molded switch slot that facilitates an insert-in switch assembly process for mounting a write protect switch. The write protect switch includes a movable switch button engaged in the switch slot, and a switch cap secured over the switch slot.

21 Claims, 25 Drawing Sheets

U.S. PATENT DOCUMENTS

| | | | |
|---|---|---|---|
| 5,835,760 | A | 11/1998 | Harmer |
| 5,891,483 | A | 4/1999 | Miyajima |
| 5,959,541 | A | 9/1999 | DiMaria et al. |
| 6,000,006 | A | 12/1999 | Bruce et al. |
| 6,012,636 | A | 1/2000 | Smith |
| 6,040,622 | A | 3/2000 | Wallace |
| 6,044,428 | A | 3/2000 | Rayabhari |
| 6,069,920 | A | 5/2000 | Schulz et al. |
| 6,102,743 | A | 8/2000 | Haffenden et al. |
| 6,125,192 | A | 9/2000 | Bjorn et al. |
| 6,148,354 | A | 11/2000 | Ban et al. |
| 6,166,913 | A | 12/2000 | Fun et al. |
| 6,193,152 | B1 | 2/2001 | Fernando et al. |
| 6,231,363 | B1 | 5/2001 | Kosmala |
| 6,241,534 | B1 | 6/2001 | Neer et al. |
| D445,096 | S | 7/2001 | Wallace |
| 6,292,863 | B1 | 9/2001 | Terasaki et al. |
| 6,297,448 | B1 | 10/2001 | Hara |
| 6,313,400 | B1 | 11/2001 | Mosquera et al. |
| 6,321,478 | B1 | 11/2001 | Klebes |
| D452,690 | S | 1/2002 | Wallace et al. |
| D452,865 | S | 1/2002 | Wallace et al. |
| D453,934 | S | 2/2002 | Wallace et al. |
| 6,381,143 | B1 | 4/2002 | Nakamura |
| 6,399,906 | B1 | 6/2002 | Sato et al. |
| 6,410,355 | B1 | 6/2002 | Wallace |
| 6,438,638 | B1 | 8/2002 | Jones et al. |
| 6,444,501 | B1 | 9/2002 | Bolken |
| 6,462,273 | B1 | 10/2002 | Corisis et al. |
| 6,475,830 | B1 | 11/2002 | Brillhart |
| 6,527,188 | B1 | 3/2003 | Shobara et al. |
| 6,570,825 | B2 | 5/2003 | Miranda et al. |
| 6,580,615 | B1 | 6/2003 | Nakanishi et al. |
| 6,615,404 | B1 | 9/2003 | Garfunkel et al. |
| 6,618,243 | B1 | 9/2003 | Tirosh |
| 6,624,005 | B1 | 9/2003 | DiCaprio et al. |
| 6,634,561 | B1 | 10/2003 | Wallace |
| 6,671,808 | B1 | 12/2003 | Abbott et al. |
| 6,676,420 | B1 | 1/2004 | Liu et al. |
| 6,718,407 | B2 | 4/2004 | Martwick |
| 6,733,329 | B2 | 5/2004 | Yang |
| 6,740,964 | B2 | 5/2004 | Sasaki |
| 6,757,783 | B2 | 6/2004 | Koh |
| 6,763,410 | B2 | 7/2004 | Yu |
| 6,773,192 | B2 | 8/2004 | Chao |
| 6,778,401 | B1 | 8/2004 | Yu et al. |
| 6,832,281 | B2 | 12/2004 | Jones et al. |
| 6,854,984 | B1 | 2/2005 | Lee et al. |
| 6,900,988 | B2 | 5/2005 | Yen |
| 6,924,547 | B2 | 8/2005 | Kanemoto et al. |
| 6,940,153 | B2 | 9/2005 | Spencer et al. |
| 6,944,028 | B1 | 9/2005 | Yu et al. |
| 7,011,247 | B2 | 3/2006 | Drabczuk et al. |
| 7,017,248 | B2 | 3/2006 | Choi et al. |
| 7,089,661 | B2 | 8/2006 | Fong et al. |
| 7,104,809 | B1 | 9/2006 | Huang |
| 7,296,098 | B2 | 11/2007 | Shih |
| 7,314,388 | B2 * | 1/2008 | Yamada et al. ............... 439/630 |
| 7,364,090 | B2 | 4/2008 | Cuellar et al. |
| 7,407,393 | B2 | 8/2008 | Ni et al. |
| 7,420,803 | B2 | 9/2008 | Hsueh et al. |
| 7,476,105 | B2 * | 1/2009 | Ni et al. ......................... 439/66 |
| 7,804,163 | B2 * | 9/2010 | Hiew et al. .................... 257/679 |
| 8,102,658 | B2 * | 1/2012 | Hiew et al. .................... 361/737 |
| 8,141,240 | B2 * | 3/2012 | Hiew et al. .................... 29/836 |
| 2001/0038547 | A1 | 11/2001 | Jigour et al. |
| 2001/0043174 | A1 | 11/2001 | Jacobsen et al. |
| 2002/0036922 | A1 | 3/2002 | Roohparvar |
| 2002/0116668 | A1 | 8/2002 | Chhor et al. |
| 2002/0166023 | A1 | 11/2002 | Nolan et al. |
| 2002/0186549 | A1 | 12/2002 | Bolken |
| 2003/0038043 | A1 | 2/2003 | Painsith |
| 2003/0046510 | A1 | 3/2003 | North |
| 2003/0100203 | A1 | 5/2003 | Yen |
| 2003/0163656 | A1 | 8/2003 | Ganton |
| 2003/0177300 | A1 | 9/2003 | Lee et al. |
| 2003/0182528 | A1 | 9/2003 | Ajiro |
| 2004/0034765 | A1 | 2/2004 | James |
| 2004/0066693 | A1 | 4/2004 | Osako et al. |
| 2004/0087213 | A1 | 5/2004 | Kao |
| 2004/0137664 | A1 | 7/2004 | Elazar et al. |
| 2004/0143716 | A1 | 7/2004 | Hong |
| 2004/0145875 | A1 | 7/2004 | Yu et al. |
| 2004/0148482 | A1 | 7/2004 | Grundy et al. |
| 2004/0153595 | A1 | 8/2004 | Sukegawa et al. |
| 2004/0255054 | A1 | 12/2004 | Pua et al. |
| 2005/0009388 | A1 | 1/2005 | Chao |
| 2005/0114587 | A1 | 5/2005 | Chou et al. |
| 2005/0182858 | A1 | 8/2005 | Lo et al. |
| 2005/0193161 | A1 | 9/2005 | Lee et al. |
| 2005/0193162 | A1 | 9/2005 | Chou et al. |
| 2005/0216624 | A1 | 9/2005 | Deng et al. |
| 2005/0218200 | A1 | 10/2005 | Focke et al. |
| 2005/0248926 | A1 | 11/2005 | Asom et al. |
| 2005/0279838 | A1 * | 12/2005 | Wang et al. .................... 235/492 |
| 2006/0231634 | A1 * | 10/2006 | Chen .............................. 235/492 |
| 2008/0093720 | A1 | 4/2008 | Hiew et al. |
| 2008/0094807 | A1 | 4/2008 | Hiew et al. |
| 2008/0191030 | A1 * | 8/2008 | Ma et al. ........................ 235/492 |

OTHER PUBLICATIONS

USB 'A' Plug Form Factor, Revision 0.9, Guideline for Embedded USB Device Applications, Nov. 29, 2004, 4 pages.

* cited by examiner

MOLDED MEMORY CARD WITH WRITE PROTECTION SWITCH ASSEMBLY

RELATED APPLICATIONS

This application is a continuation-in-part (CIP) of U.S. Patent application for "Direct Package Mold Process For Single Chip SD Flash Cards", U.S. application Ser. No. 12/175,753, filed Jul. 18, 2008.

This application is a continuation-in-part (CIP) of U.S. Patent application for "SD Flash Memory Card Manufacturing Using Rigid-Flex PCB", U.S. application Ser. No. 12/106,517, filed Apr. 21, 2008.

This application is also a CIP of U.S. Patent application for "Manufacturing Process for Single-Chip MMC/SD Flash Memory Device With Molded Asymmetric Circuit Board", U.S. application Ser. No. 11/831,888, filed Jul. 31, 2007.

This application is also a CIP of co-pending U.S. Patent Application for "Fixed Write-Protect Seamless Memory Card", Ser. No. 11/770,661, filed on Jun. 28, 2007.

This application is also a CIP of co-pending U.S. Patent Application for "Two Step Molding Process Secured Digital Card Manufacturing Method and Apparatus", Ser. No. 11/744,125, filed on May 3, 2007.

FIELD OF THE INVENTION

This invention relates to portable electronic devices, and more particularly to portable memory card devices such as those that utilize the Secure-Digital (SD) specification, and even more particularly to a manufacturing process for producing SD flash memory cards utilizing a single chip package molding technique.

BACKGROUND OF THE INVENTION

A card-type electronic apparatus containing a memory device (e.g., an electrically erasable programmable read-only memory (EEPROM) or "flash" memory chip) and other semiconductor components is referred to as a memory card. Typical memory cards include a printed circuit board assembly (PCBA) mounted or molded inside a protective housing or casing. The PCBA typically includes a printed circuit substrate (referred to herein simply as a "substrate") formed using known printed circuit board fabrication techniques, with the memory device and additional components (e.g., control circuitry, resistors, capacitors, inductors, etc.) formed on an upper surface of the substrate (i.e., inside the casing), and one or more rows of contact pads exposed on a lower surface of the substrate. The contact pads are typically aligned in a width direction of the casing, and serve to electrically connect and transmit electrical signals between the memory chip/control circuitry and a card-hosting device (e.g., a computer circuit board or a digital camera). Examples of such portable memory cards include secure digital (SD) cards, multi media cards (MMC cards), personal computer memory card international association (PCMCIA) cards. An exemplary SD card form factor is 24 mm wide, 32 mm long, and 2.1 mm thick, and is substantially rectangular except for a chamfer formed in one corner, which defines the front end of the card that is inserted into a card-hosting device. The card's contact pads are exposed on its lower surface of each card near the front end. These and other similar card-like structures are collectively referred to herein as "memory module cards" or simply as "memory cards".

An important aspect of most memory card structures is that they meet size specifications for a given memory card type. In particular, the size of the casing or housing, and more particularly the width and thickness (height) of the casing/housing, must be precisely formed so that the memory card can be received within a corresponding slot (or other docking structure) formed on an associated card-hosting device. For example, using the SD card specifications mentioned above, each SD card must meet the specified 24 mm width and 2.1 mm thickness specifications in order to be usable in devices that support this SD card type. That is, if the width/thickness specifications of a memory card are too small or too large, then the card can either fail to make the necessary contact pad-to-card-hosting device connections, or fail to fit within the corresponding slot of the associated card-hosting device.

Present SD memory card manufacturing is mainly implemented using standard surface-mount-technology (SMT) or chip-on-board (COB) manufacturing techniques, which are well known. The memory, controller and passive devices of each SD card device are typically mounted onto a rigid (e.g., FR or BT material) printed-circuit-board (PCB), which is then mounted inside of a pre-molded plastic housing.

Conventional production methods utilized to manufacture SD card devices present several problems.

First, using SMT methods alone to mount the various electronic components on the rigid PCB has the disadvantage of limiting the number of flash memory devices that can mounted on each SD device due to the thickness and width limitations on the SD card. That is, because the flash memory and controller chips have widths and thicknesses that are defined by the chip packaging dimensions, and because of the restrictions on total thickness of each SD card, only a limited number of packaged flash memory devices can be mounted inside each SD device using SMT methods. The space available for memory devices is further limited by the space needed for the pre-molded plastic housing, which is disposed on both sides of the PCBA. Further, even if room were available inside the housing, it would be too costly to stack "packaged" IC chips, and it would not be practical at present as SD flash card has it own standard shape and form.

Another possible approach to avoiding the vertical space limitations of SMT and pre-molded housings would be to use COB assembly methods to mount IC die onto a rigid PCB, and then using an over-molding process to form the housing. However, this over-molding method has the disadvantage of plastic flash spilling over the connector pins which causes poor electrical contact. Also, it is hard to mold multiple PCBA simultaneously using single molding process, which results in higher manufacturing costs.

What is needed is a method for producing memory cards that maximizes the amount of volume that can be used to house memory and control ICs, and avoids the problems mentioned above that are associated with conventional production methods.

SUMMARY OF THE INVENTION

The present invention is directed to memory card (e.g., SD or MMC) devices including a PCBA in which all components (e.g., active components such as controller circuits and flash memory, and passive components such as resistors and capacitors) are mounted only on one side of a PCB, and an integral plastic molded casing that is formed over both upper an lower surfaces of the PCBA in a single shot molding process such that standard metal contacts disposed on the PCB are exposed through openings defined the molded casing, and the components are encased (encapsulated) within the plastic molded casing. The PCBA is produced by mounting at least one passive component and at least one integrated circuit onto a selected surface of the PCB. The molded casing is then formed by depositing thermoset plastic over the upper and lower surfaces of the PCB such that the components are encased by the thermoset plastic, and, in the case of SD devices, the thermoset plastic also forms ribs between the standard metal contacts and protective walls over the surfaces of the PCB. In accordance with an aspect of the present invention, the single-piece molded casing facilitates production of physically rigid (i.e., high impact resistant) memory cards that exhibit high moisture resistance by filling gaps and spaces around the components that are otherwise not filled when pre-molded covers are used. The molded casing also enables the use of a wide range of memory devices by allowing the thermoplastic casing material formed over the memory device to be made extremely thin. For example, SD devices may be alternately produced using SLC or MLC types flash memory devices without requiring changes to the molding dies. Further, the molding process facilitates forming SD cards in which all of the components are formed on the PCB surface opposite to the standard metal contacts with a varying number of memory die without requiring changes to the molding dies. In an alternative embodiment disclosed herein, SD devices are produced which all of the components are formed on same (e.g., upper) PCB surface as the standard metal contacts (i.e., by disposing the metal contacts on raised block), and an extremely thin plastic layer is formed over the opposite (e.g., lower) surface of the PCB, thereby maximizing Z-axis area of the SD device for components.

According to an aspect of the present invention, high quality SD/MMC (memory card) devices (or other electronic data storage medium) utilize the one-shot molding process to provide a pre-molded switch slot on the side and lower wall of the molded plastic casing, and the present invention introduces an insert-in write protect switch mounting process that facilitates low-cost assembly of a write protect switch assembly on the memory card device. The pre-molded switch slot includes a cavity that is exposed by a side (first) opening and a bottom (second) opening that are defined in the molded plastic casing. The write protect switch assembly includes a movable switch button and a switch cap that are separately molded and separately attached to the molded plastic casing. The movable switch button is mounted first, and includes a base portion that is movably engaged in the cavity of the pre-molded switch slot, and a button top extending through the side opening. The switch cap is then secured over bottom opening such that a flat wall portion of the switch cap covers the base portion of the movable switch button. The write protect switch assembly attaches on the one shot molded memory card body with various embodiments which are described herein. The package housing is applying to both modular COB and conventional SMT types PCBA. This combination provides an advantage over conventional techniques in that attaching the write protect switch assembly to the molded casing (i.e., instead of to the PCBA) with the switch button encapsulated in between two molded pieces (i.e., a portion of the molded casing and the flat wall of the switch cap) provides a sturdy and reliable protective structure that resists undesirable detachment of the movable switch button during use.

In accordance with an embodiment of the present invention, a method for producing SD devices includes forming a PCB panel including multiple PCB regions arranged in rows and columns, and attaching at least one passive component and at least one integrated circuit to each PCB region. Each PCB panel has card body corner and standard notch features characteristic of SD cards punched out during PCB fabrication process. The PCB panel is then mounted inside a molding cavity, and a thermal plastic material is molded over the passive component and integrated circuit to form the molded casing. Standard features of the final SD form factor, such as notches, corners and ribs, are defined on one or both of the upper and lower molding plates (dies) to facilitate forming the molded casing as an integral molded plastic structure casing over each PCB panel region in a (i.e., such that the bare PCB panel enters the molding apparatus, and the molded plastic casing is completed before removal of the PCB panel from the molding apparatus). In one embodiment, the mold defines a space for the write protect switch assembly process described herein. In another embodiment vacuum suction holes are disposed on contact support structures within the molding apparatus that hold the standard metal pads of each PCB panel region as tight as possible to associated surfaces to allow plastic compound to fill all surrounding cavity space without forming plastic over the metal contacts. In other embodiments, release film or a Teflon coating is disposed on the molding apparatus surface (i.e., between the molding apparatus and the PCB panel regions) to assist molding such that plastic bleed and flash problems can be effectively eliminated. Singulation is then performed to separate the individual SD devices from, e.g., the peripheral panel support structure and adjacent devices using a saw machine or other cutting device. Note that the molded casing and the PCB material are cut during the same cutting process, whereby end edges of the PCB are exposed at each end of the finished device. This method facilitates the production of memory card devices at a lower cost and higher assembly throughput than that achieved using conventional production methods.

According to an aspect of the invention, passive components are mounted onto the PCB panel using one or more standard surface mount technology (SMT) techniques, and one or more integrated circuit (IC) die (e.g., an SD controller IC die and a flash memory die) are mounted using chip-on-board (COB) techniques. During the SMT process, the SMT-packaged passive components (e.g., capacitors and oscillators) are mounted onto contact pads disposed on each PCB of the PCB panel, and then known solder reflow techniques are utilized to connect leads of the passive components to the contact pads. During the subsequent COB process, the IC dies are secured onto the PCBs using known die-bonding techniques, and then electrically connected to corresponding contact pads using, e.g., known wire bonding techniques. After the COB process is completed, the casing is formed over the passive components and IC dies using plastic molding techniques. By combining SMT and COB manufacturing techniques to produce SD devices, the present invention provides an advantage over conventional manufacturing methods that utilize SMT techniques only in that overall manufacturing costs are reduced by utilizing unpackaged controllers and flash devices (i.e., by eliminating the cost associated with SMT-package normally provided on the controllers and flash devices). Moreover, the molded casing provides greater moisture and water resistance and higher impact force resistance than that achieved using conventional manufacturing methods. Therefore, the combined COB and SMT method according to the present invention provides a less expensive and higher quality (i.e., more reliable) memory product than that possible using conventional SMT-only manufacturing methods.

Various stacking arrangements of memory devices are facilitated according to additional alternative embodiments of the present invention, whereby the present invention facilitates the production of SD devices having a variety of storage capacities with minimal changes to the production process (i.e., simply changing the number of memory die layers changes the memory capacity). A metal sheet is added in one embodiment to provide parasitic electro magnetic wave shielding also for higher aesthetic value.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in manufacturing methods for SD (and MMC) devices, and to the improved SD devices made by these methods. The following description is presented to enable one of ordinary skill in the art to make and use the invention as provided in the context of a particular application and its requirements. As used herein, the terms "upper", "upwards", "lower", "top", "bottom", "front", "rear", "side" and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
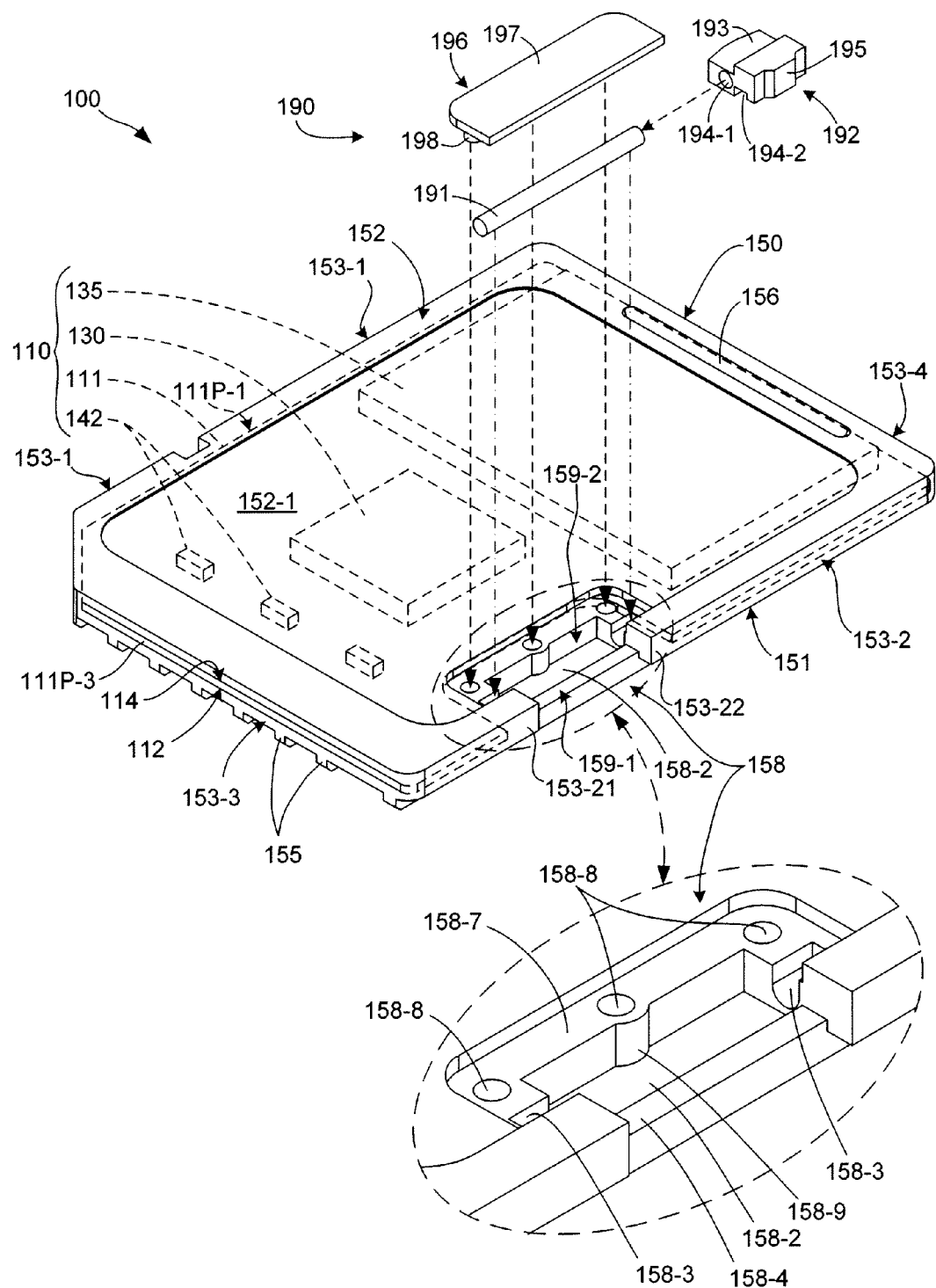
FIGS. 1(A) and 1(B) are exploded top and bottom perspective views showing an exemplary SD device according to an embodiment of the present invention.
Figure 1B:
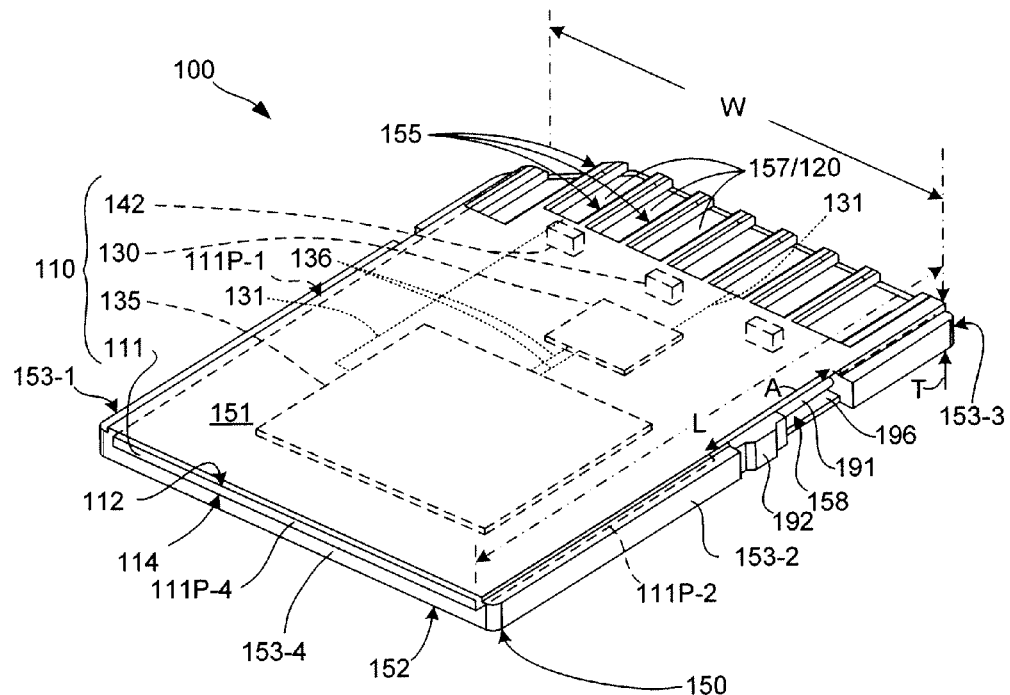
Figure 2:
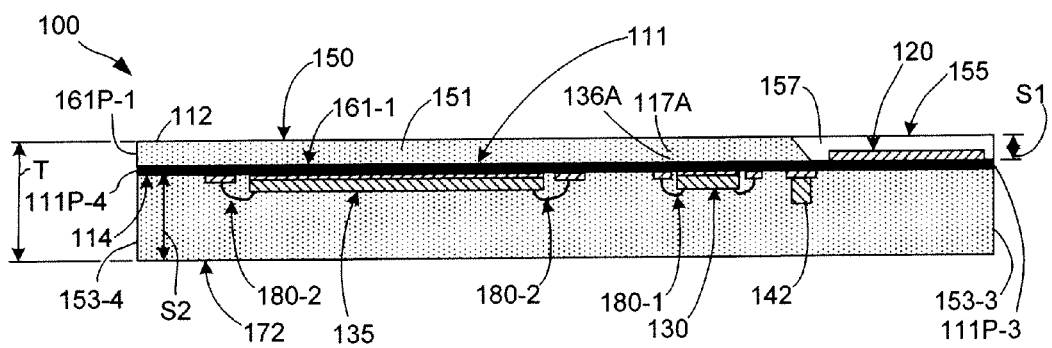
FIG. 2 is a cross sectional side view showing the exemplary SD of FIG. 1.

FIGS. 1(A), 1(B) and 2 are perspective and cross-sectional side views showing a SD device 100 according to a first embodiment of the present invention. SD device 100 generally includes a printed circuit board assembly (PCBA) 110, and an integral plastic molded casing 150 including a top wall 151 disposed over an upper (first) side 112 of PCBA 110, and a bottom wall 152 disposed over a lower (second) side 114 of PCBA 110. As used herein, the term "integral" is used to characterize plastic molded casing 150 as a single-piece plastic structure such that both top wall 151 and lower wall 152 are substantially simultaneously formed by applying molten plastic (e.g., using injection or transfer molding techniques) over both surfaces of PCBA 110, as opposed to one or both walls covering the PCBA being pre-molded and mounted onto the PCBA. PCBA 110 includes a PCB 111 that includes nine standardized (plug) metal contacts 120 (shown in FIG.

1(B)) formed on upper surface 112 thereof, and several components, including IC dies 130 and 135 and passive components 142, which are attached to lower surface 114 of PCB 111. As indicated in FIG. 1(B), metal contacts 120 are shaped and arranged in a pattern established by the SD specification, and are exposed through openings 157 defined molded casing 150.

Referring to FIGS. 1(B) and 2, PCB 111 is formed in accordance with known PCB manufacturing techniques such that metal contacts 120, IC dies 130 and 135, and passive components 142 are electrically interconnected by a predefined network including conductive traces 131 and 136 and other conducting structures that are sandwiched between multiple layers of an insulating material (e.g., a resin material such as FR-4 or Bismaleimide-Triazine (BT)) and adhesive. PCB 111 may also be formed by adding a polyimide stiffener to flexible cable to provide suitable stiffness of the active surfaces where connector gold fingers and passive components 142 are mounted, which require a still surface to perform the SMT procedure described below.

According to an aspect of the invention, passive components are mounted onto surface 114 of PCB 111 using one or more standard surface mount technology (SMT) techniques, and one or more integrated circuit (IC) die (e.g., a controller IC die 130 and one or more flash memory dies 135) are mounted onto surface 114 of PCB 111 using chip-on-board (COB) techniques. As indicated in FIG. 2, during the SMT process, the passive components 142, such as capacitors and inductors, are mounted onto contact pads (described below) disposed on surface 114, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 and 135 are unpackaged, semiconductor "chips" that are mounted onto surface 114 and electrically connected to corresponding contact pads using known COB techniques. For example, as indicated in FIG. 2, control IC die 130 is electrically connected to PCB 111 by way of wire bonds 180-1 that are formed using known techniques. Similarly, flash memory IC die 135 is electrically connected to PCB 111 by way of wire bonds 180-2. Passive components 142, IC dies 130 and 135 and metal contacts 120 are operably interconnected by way of metal traces 131 and 136 (depicted in FIG. 1 in a simplified manner by short dashed lines) that are formed on and in PCB 111 using known techniques. In one alternative embodiment (not shown), controller IC die 130 is mounted onto a front portion of PCB 111 (i.e., on lower surface 114 opposite to metal contacts 120) to provide additional space near the rear portion of PCB 111 for memory IC die 135, thus facilitating larger memory dies and thus more memory capacity.

As indicated in FIGS. 1(B) and 2, molded casing 150 has a length L, a width W and a front-end thickness T that are determined according to predetermined standards (e.g., SD or MMC standards). Molded casing 150 generally includes a substantially planar upper wall 151, bottom wall 152, and peripheral walls including side walls 153-1 and 153-2 and front and rear walls 153-3 and 153-4 that extend between corresponding edges of upper wall 151 and lower wall 152. Ribs 155 extend in parallel from front wall 153-3 over the front section of PCB 111, and define openings 157 therebetween. As shown in FIG. 1(A), a finger catch 156 is integrally formed on lower wall 152 near rear wall 153-4. According to SD standards, side walls 153-1 and 153-2 define one or more notches (e.g., write protect notch 154-1) that serve to house an optional write protect switch (not shown). Note that PCB 111 is disposed inside molded casing 150 such that side edges 111P-1 and 111P-2 of PCB 111 are covered by side walls 153-1 and 153-2, respectively (i.e., the molding dies described below, define cavity regions that in turn define the side and end contours of molded casing 150), but that front edge 111P-3 (see FIG. 2) and rear edge 111P-4 are exposed through front wall 153-3 and 153-4, respectively.

According to an aspect of the present invention, the molding process utilized to form integral plastic molded casing 150 facilitates forming SD and MMC cards having different flash memory types and capacities without requiring changes to the molding dies. For example, as indicated in FIG. 2, molded casing 150 has an overall thickness T that is set by SD standards at 2.1 mm thick, of which upper wall 151 requires a thickness S1 of 0.7 mm in order to form ribs 155 according to SD standards, leaving a thickness S2 of 1.4 mm for lower wall 152. By forming integral plastic molded casing 150 in a single-shot molding process, the plastic material forming lower wall 152 entirely encases (encapsulates) components 130, 135 and 142. As used herein, the terms "encase" and "encapsulate" and their derivatives are used to describe the relationship between plastic molded casing 150 and components 130, 135 and 142 whereby substantially all exposed surface areas of these components and lower surface 114 are contacted by plastic material that is applied in a molten form and then sets (hardens) in a shape determined by the external surfaces of components and associated connections (e.g., the wire bonds), thereby securing the components to lower surface 114. In contrast, components enclosed by a pre-molded housing are not "encased" in that the shape of the pre-molded housing is not determined by the external surfaces of components and associated connections. In addition, various flash memory devices 135 (e.g., SLC or MLC) may be incorporated into the production process without requiring alterations to the molding die to account for slight variations in die shape and size. Further, as described below with reference to FIGS. 20-22, a die stacking method may be utilized to increase the memory capacity of each SD device without requiring changes to the molding die (i.e., the additional Z-axis space S2 filled with plastic material in the embodiment shown in FIG. 2 may be taken up by additional memory dies.

Referring to FIG. 1(A), according to a specific aspect of the present invention, plastic molded casing 150 also defines a pre-molded switch slot 158, and SD device 100 also includes a write protect switch assembly 190 including a switch button 192 and a switch cap 196 that are secured to casing 150 over pre-molded switch slot 158 using a low-cost insert-in assembly process such that switch button 192 is movably secured to the switch slot and is partially exposed on side wall 153-2 for manipulation by a user.

Referring to the upper portion of FIG. 1(A), in the disclosed embodiment, in addition to switch button 192 and switch cap 196, which are formed by known plastic molding techniques, write protect switch assembly 190 also includes a metal rod 191 on which switch button 192 is slidably mounted. Switch button 192 includes a base portion 193 that defines a through-hole 194-1, and a button top 195 that defines a retaining slot 194-2. Switch cap 196 includes a flat wall portion 197, and three poles (protrusions) 198 extending downward from a lower surface of flat wall portion 197. Referring to the lower portion of FIG. 1(A), pre-molded switch slot 158 includes an elongated cavity 158-2 that is defined in casing 150 and is exposed by a first opening 159-1 defined between side wall portions 153-21 and 153-22 of side wall 153-2, and by a second opening 159-2 defined in a portion of lower wall 152. Pre-molded switch slot 158 includes several structures that are formed to accommodate mounting of write protect switch assembly 190 using a low-cost insert-in assembly process. In particular, pre-molded switch slot 158 includes two slots (openings) 158-3 disposed at opposite ends of elongated cavity 158-2 and defined by portions of plastic casing 150 respectively located adjacent to first and second side wall portions 153-21, a low retention wall 158-4 disposed between side wall portions 153-21 and 153-22, a support shelf 158-7 disposed around an inside edge of elongated cavity 158-2, and three retention holes (openings) 158-8 that extend downward into support shelf 158-7. In addition, a positioning bump 158-9 is formed on a side wall of cavity 158-2, as serves as click-through barrier for preventing switch button 192 from inadvertently sliding into an undesired read/write position (i.e., the movement of switch button 192 is restricted by positioning bump 158-9 such that switch button 192 is prevented from inadvertently sliding from the "read only" position adjacent to side wall section 153-21 to the "write allowed" position adjacent to side wall 153-22 while being transported in a user's pocket). The purposes of the other features are described below.

Figure 19A:
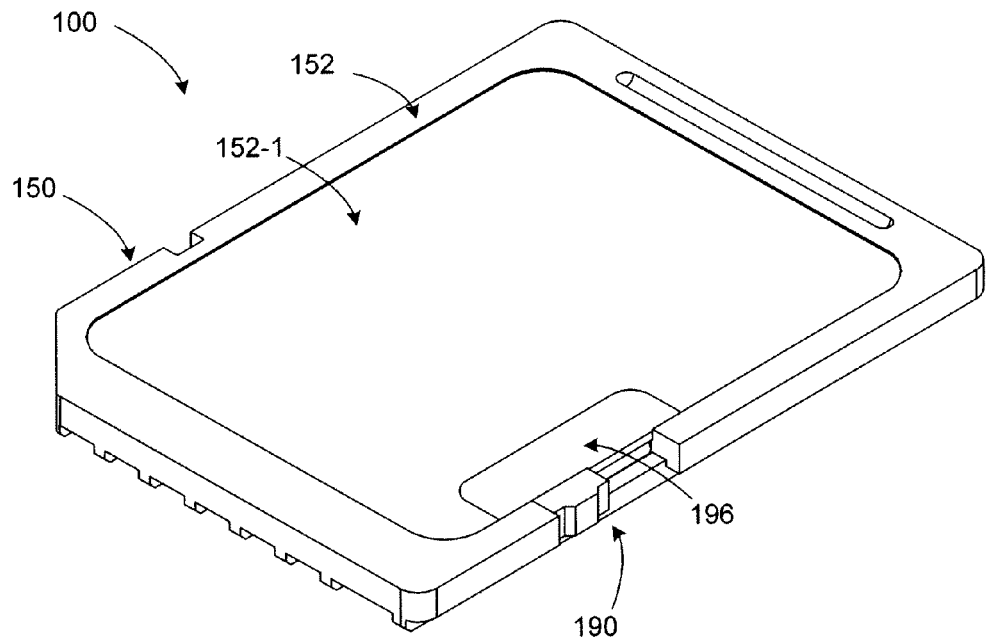
FIGS. 19(A) and 19(B) are simplified top perspective views, respectively, showing an SD device after performing an insert-in write protect switch assembly process and a marking process, respectively, according to the method of FIG. 3.

Referring to FIG. 1(A), the low-cost insert-in assembly process is performed as follows. First, as indicated by the horizontal arrow, prior to mounting into switch slot 158, switch button 192 is mounted onto metal rod 191 by inserting metal rod 191 into through-hole 194-1 such that the ends of metal rod 191 protrude from both sides of switch button 192. Next, as indicated by the vertical dash-dot-line arrows, the assembly including metal rod 191 and switch button 192 is mounted onto casing 150 such that opposing ends of metal rod 191 are received in openings 158-1, and such that retention wall 158-4 is slidably received inside slot 194-2 (i.e., such that base portion is received inside elongated cavity 158-2, and button top 195 faces away from casing 150). Next, switch cap 196 is mounted onto casing 150 by inserting poles 198 into retention openings 158-8 and securing poles 198, e.g., using an adhesive. Switch cap 196 is mounted such that flat wall portion 197 is supported on support shelf 158-7 and encloses second opening 159-2 such that base portion 193 is covered by the flat wall portion 197 (e.g., as shown in FIG. 19(A)). Note that securing switch cap 196 in this manner does not impede sliding movement of switch button 192 along metal rod 191, but prevents metal rod 191 and switch button 192 from being inadvertently pulled out of cavity 158-2. FIG. 1(B) shows SD device 100 after the insert-in assembly process is completed, with switch button 192 secured by switch cap 196 and metal rod 191 such that it slides relative to casing 150 in the directions indicated by arrow A. Referring again to FIG. 1(A), note that lower wall 152 includes an optional 0.1 mm surface indentation (depression) forming a centrally located recessed wall section 152-1. Recessed wall section 152-1 is integrally formed in lower wall 152 during the one-shot molding process, and is provided to compensate for the thickness of a stick-on type logo sheet typically used for device marking. Note that switch cap 196 is formed such that an upper planar surface of flat wall portion 197 is coplanar with the upper surface of recessed wall section 152-1 after the insert-in assembly process is completed. The completed assembly showing switch cap 196 mounted on casing 150 is described below in further detail with reference to FIG. 19(B).

Figure 3:
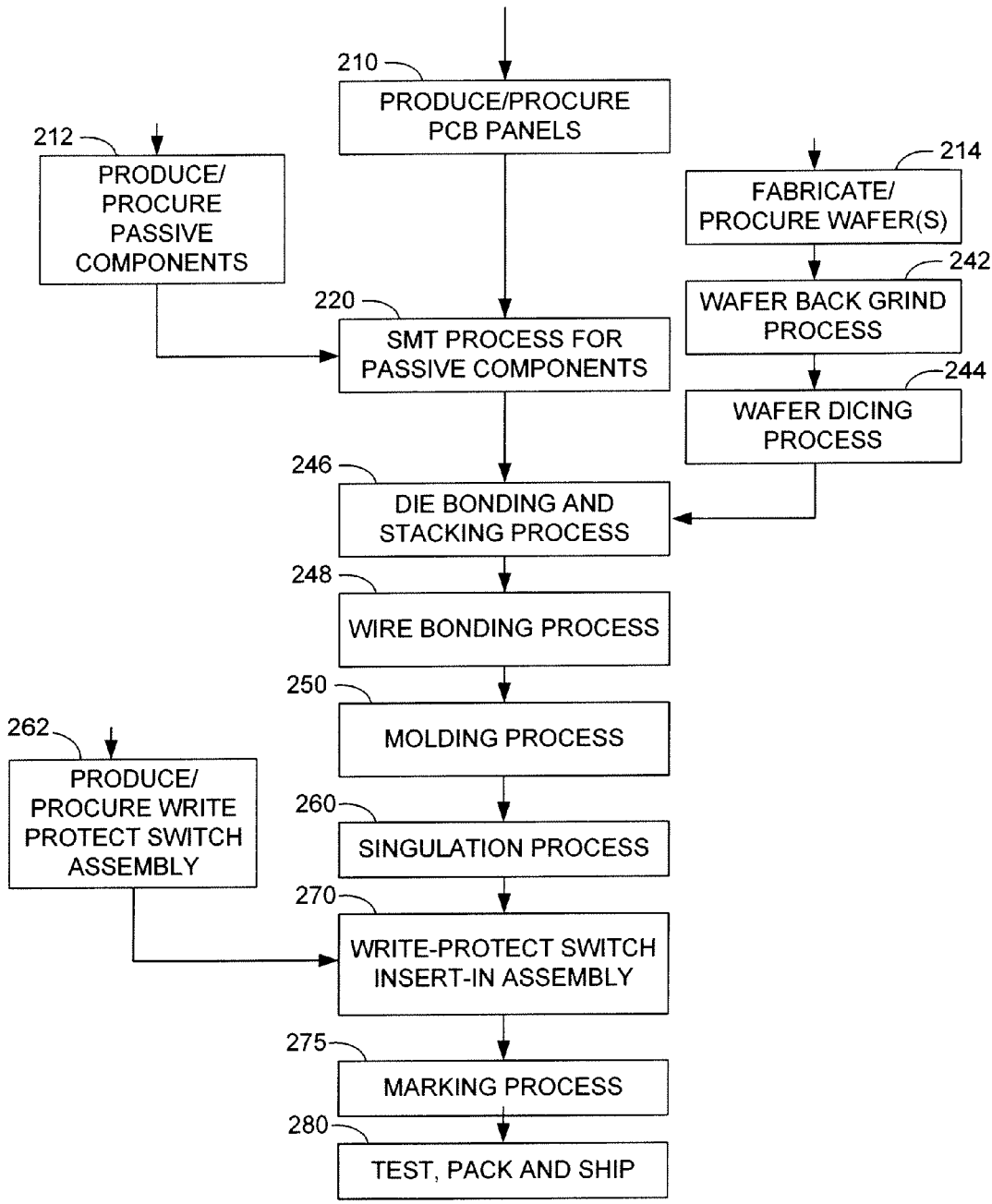
FIG. 3 is a flow diagram showing a method for producing the SD device of FIG. 1 according to another embodiment of the present invention.

FIG. 3 is a flow diagram showing a method for producing SD or MMC devices (e.g., SD device 100) according to another embodiment of the present invention. Summarizing the novel method, a PCB panel is generated using known techniques (block 210), passive components are produced/procured (block 212), and integrated circuit (IC) wafers are fabricated or procured (block 214). The passive components are mounted on the PCB panel using SMT techniques (block 220), and the IC dies are subject to a grind-back process (block 242) and dicing process (block 244) before being die bonded (block 246) and wire bonded (block 248) onto the PCB panel using known COB techniques. The PCB panel is then mounted into an injection or transfer molding apparatus, and molten plastic is then used to form molded thermal plastic over the passive components and the IC dies (block 250). Then the PCB panel/upper casing panel assembly is singulated (cut) in to separate devices (block 260). After procuring or producing write protect assemblies (e.g., write protect assembly 190, described above with reference to FIG. 1 or as described below; block 262) an insert-in write-protect switch assembly process is performed (block 270), followed by device marking (block 275). Finally, the devices are tested, packed and shipped (block 280) according to customary practices.

The method for producing SD devices shown in FIG. 3 provides several advantages over conventional manufacturing methods. First, in comparison to methods that utilize SMT techniques only, by utilizing COB techniques to mount the SD/MMC controller and flash memory, the large amount of space typically taken up by the packages associated with these devices is dramatically reduced, thereby facilitating significant space. Second, by implementing the wafer grinding methods described below, the die height is greatly reduced, thereby facilitating a stacked memory arrangement that a significant memory capacity increase over packaged flash memory arrangements. The closely spaced IC die facilitate better performance due to decreased interconnection length and associated resistances. The use of a (instead of two or more mold shots) to form the final SD/MMC package provides greater moisture and water resistance and higher impact force resistance than that achieved using conventional manufacturing methods (i.e., mounting PCBAs inside of pre-molded housings), and reduces the amount of space required for the plastic package. In comparison to the standard SD/MMC memory card manufacturing that used SMT process, it is cheaper to use the combined COB and SMT (plus molding) processes described herein because, in the SMT-only manufacturing process, the bill of materials such as flash memory and the controller chip are also manufactured by COB process, so all the COB costs are already factored into the packaged memory chip and controller chip. Therefore, the single molding shot, combined COB and SMT method according to the present invention provides a less expensive and higher quality (i.e., more reliable) memory product with a smaller size than that possible using conventional manufacturing methods.

The flow diagram of FIG. 3 will now be described in additional detail below with reference to FIGS. 4(A) to 19.

Referring to the upper portion of FIG. 3, the manufacturing method begins with filling a bill of materials including producing/procuring PCB panels (block 210), producing/procuring passive (discrete) components (block 212) such as resistors and capacitors that are packaged for SMT processing, and producing/procuring a supply of IC wafers (or individual IC dies, block 214).

Figure 4A:
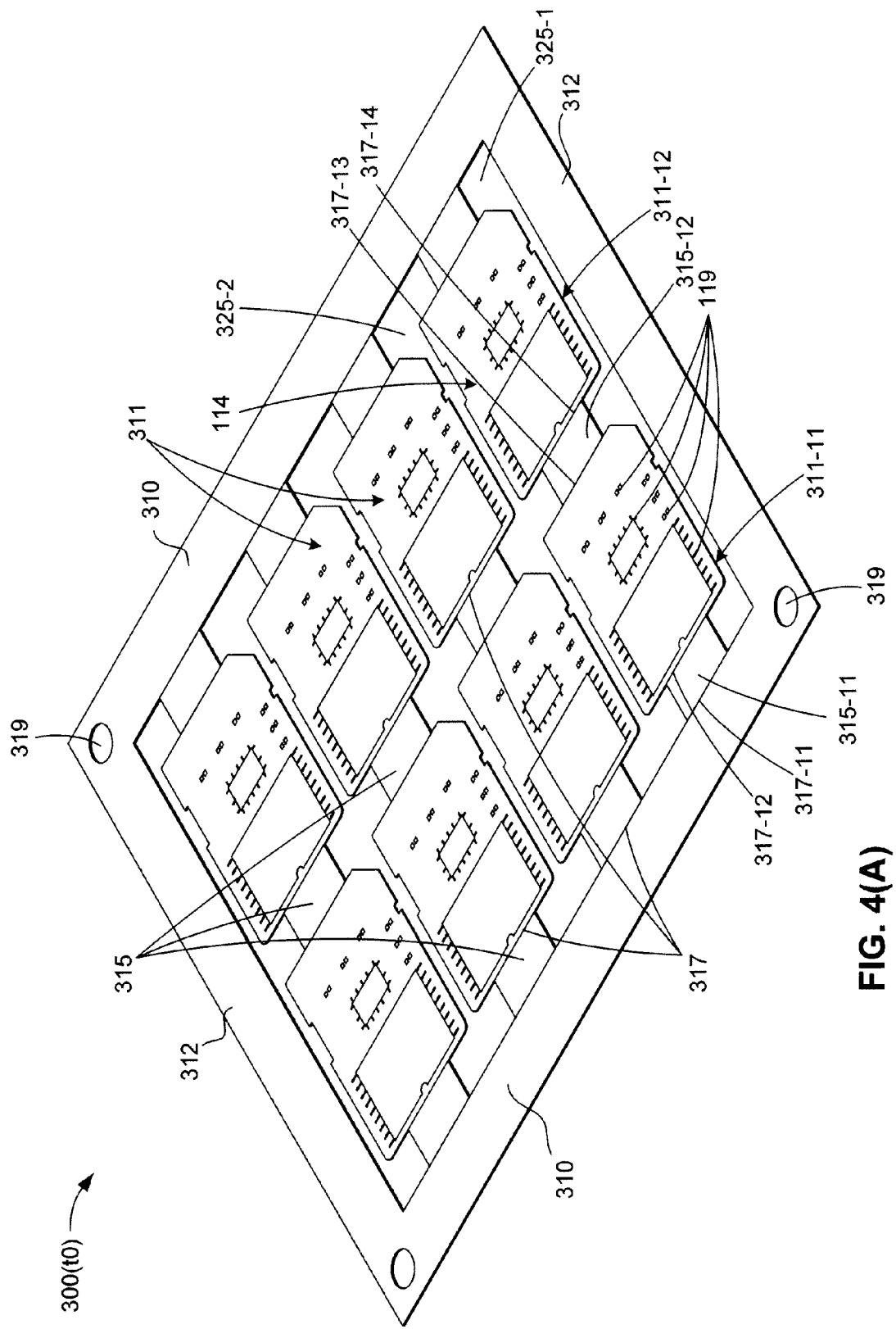
FIGS. 4(A) and 4(B) are bottom and top perspective views showing a PCB panel utilized in the method of FIG. 3 according to an embodiment of the present invention.
Figure 4B:
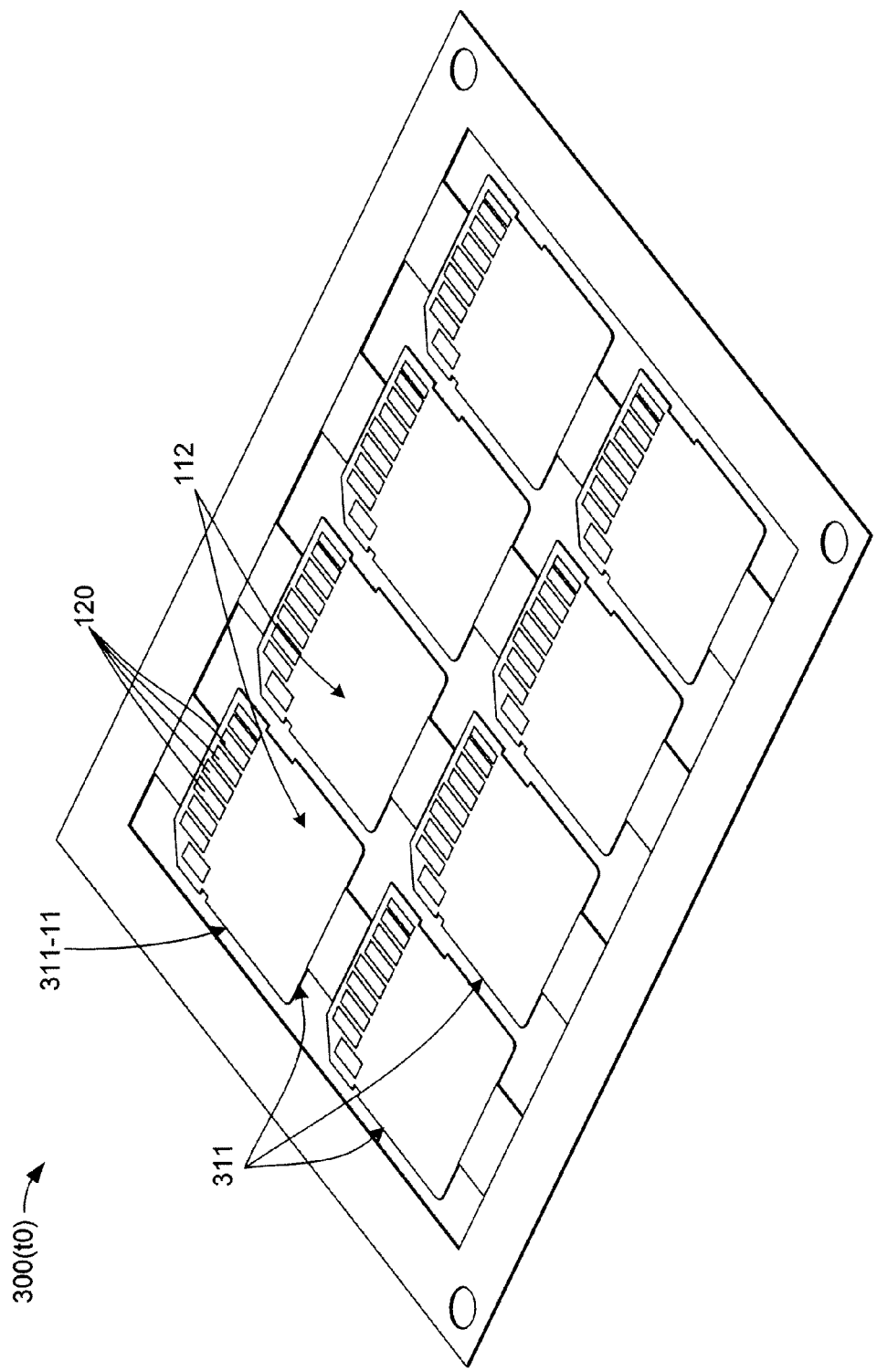

FIGS. 4(A) and 4(B) are simplified bottom and top views, respectively, showing a PCB panel 300(t0) provided in block 210 of FIG. 3 according to a specific embodiment of the present invention. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional sequential production processes.

As indicated in FIGS. 4(A) and 4(B), PCB panel 300(t0) includes a four-by-2 matrix of PCB regions 311 that are surrounded by opposing end border structures 310 and side border structures 312, which are integrally connected to form a rectangular frame of blank material around PCB regions 311. Each PCB region 311 (which corresponds to substrate 111; see FIG. 1) has the features described above with reference to FIGS. 1 and 2, and the additional features described below. FIG. 4(A) shows lower surface 114 of each PCB region 311, and FIG. 4(B) shows upper surface 112 of each PCB region 311, which includes standard metal contacts 120. Note that lower surface 114 of each PCB region 311 (e.g., PCB region 311-11) includes multiple contact pads 119 arranged in predetermined patterns for facilitating SMT and COB processes, as described below.

Referring to FIG. 4(A), each PCB region 311 in each row is connected to an end border structure 310 and to an adjacent PCB region 311 by way of intervening bridge pieces 315 that are removed after molding is completed (discussed below). For example, referring to the lower row of PCBs in FIG. 4(A), PCB region 311-11 is connected to the left end border structure 310 by way of PCB bridge piece 315-11 and to PCB region 311-12 by way of PCB bridge piece 315-12. To facilitate their removal, optional designated cut lines 317 are scored or otherwise partially cut into the PCB material at each end of each bridge piece. For example, bridge piece 315-11 includes cut lines 317-11 and 317-12 at the ends thereof, and bridge piece 315-12 includes cut lines 317-13 and 317-14 at the ends thereof. In an alternative embodiment, cut lines 317 may be omitted, or comprise surface markings that do not weaken the panel material. Note that side edges of each PCB region 311 are exposed by elongated slots (openings) that extend between end border regions 310. For example, side edges of PCB sections 311-11 and 311-12 are exposed by elongated punched-out slots (lanes) 325-1 and 325-2. FIG. 4(B) is a top side view of PCB panel 300 showing upper surfaces 112 of PCB regions 311, and shows that metal contacts 120 are formed on each PCB region 311 (e.g., PCB region 311-11).

Referring again to FIG. 4(A), in accordance with yet another aspect of the present invention, border structures 310 and 312 are provided with positioning holes 319 to facilitate alignment between PCB panel 300 and the plastic molding die during molded casing formation, as described below.

Figure 5:
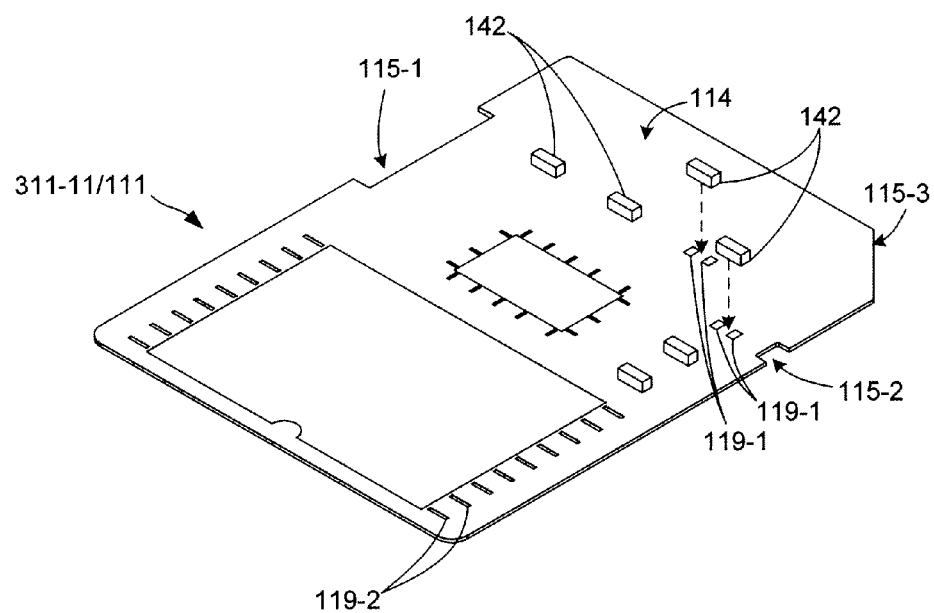
FIG. 5 is a perspective view depicting a surface mount technology (SMT) process for mounting passive components on a PCB according to the method of FIG. 3.
Figure 6:
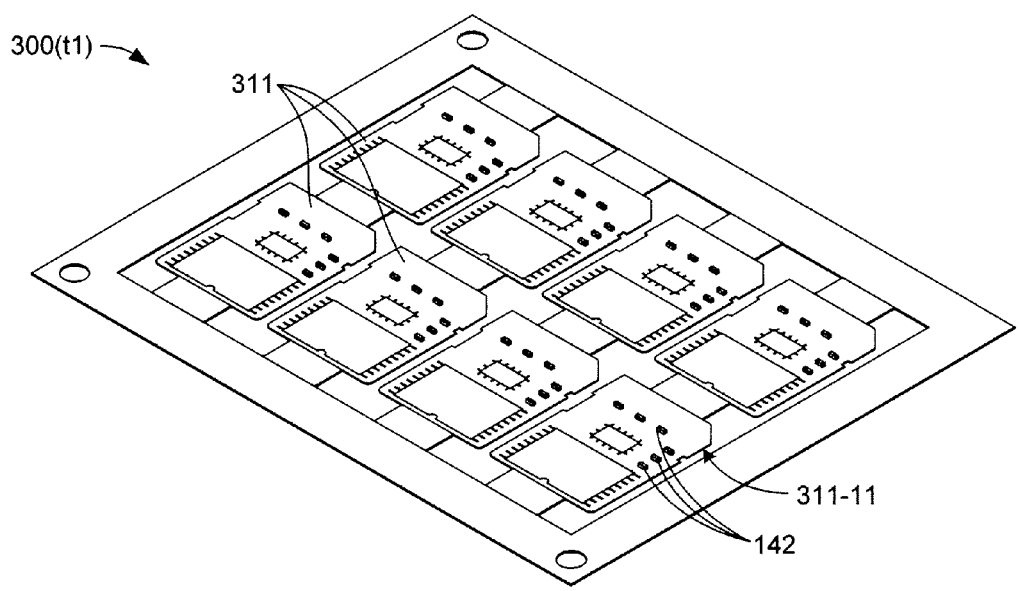
FIG. 6 is a top view showing the PCB panel of FIG. 4(B) after the SMT process is completed.

FIG. 5 is a perspective view depicting a PCB region 311-11 of panel 300(t0) during a SMT process that is used to mount passive components on PCB region 311-11 according to block 220 of FIG. 3. Note that PCB region 311-11 (which corresponds to PCB substrate 111 of FIG. 1) is shown separate from panel 300(t0) for illustrative purposes, and is actually integrally formed with the remainder of panel 300(t0) during the process steps described below preceding singulation. During the first stage of the SMT process, lead-free solder paste (not shown) is printed on contact pads 119-1, which in the present example corresponds to SMT components 142, using custom made stencil that is tailored to the design and layout of PCB region 311-11. After dispensing the solder paste, the panel is conveyed to a conventional pick-and-place machine that mounts SMT components 142 onto contact pads 119-1 according to known techniques. Upon completion of the pick-and-place component mounting process, PCB panel 300(t0) is then passed through an IR-reflow oven set at the correct temperature profile. The solder of each pad on the PC board is fully melted during the peak temperature zone of the oven, and this melted solder connects all pins of the passive components to the finger pads of the PC board. FIG. 6 shows the resulting sub-assembled PCB panel 300(t1), in which each PCB region 311 (e.g., PCB region 311-11) includes passive components 142 mounted thereon by the completed SMT process.

Referring again to FIG. 5, the opposing side edges of each PCB region 311 (e.g., region 311-11) respectively define a write-protect notch 115-1, a notch 115-2 for providing stable firm grip, and a card body corner 115-3.

Figure 7:
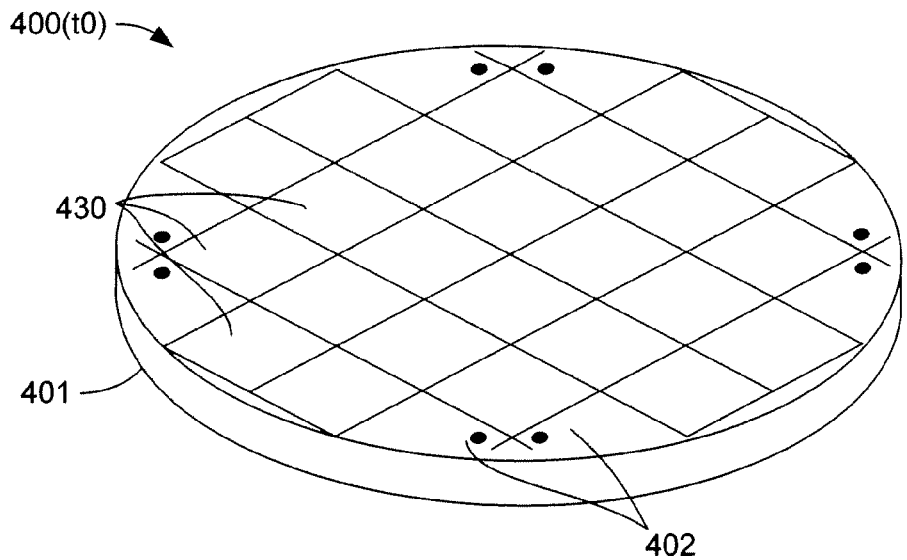
FIG. 7 is a simplified perspective view showing a semiconductor wafer including integrated circuits (ICs) utilized in the method of FIG. 3.

FIG. 7 is a simplified perspective view showing a semiconductor wafer 400(t0) procured or fabricated according to block 214 of FIG. 3. Wafer 400(t0) includes multiple ICs 430 that are formed in accordance with known photolithographic fabrication (e.g., CMOS) techniques on a semiconductor base 401. The corner partial dies 402 are inked out during die probe wafer testing, as are complete dies that fail electrical function or DC/AC parametric tests. In the example described below, wafer 400(t1) includes ICs 430 that comprise SD controller circuits. In a related procedure, a wafer (not shown) similar to wafer 400(t1) is produced/procured that includes flash memory circuits, and in an alterative embodiment, ICs 430 may include both SD controller circuits and flash memory circuits. In each instance, these wafers are processed as described herein with reference to FIGS. 8(A), 8(B) and 8(C).

Figure 8A:
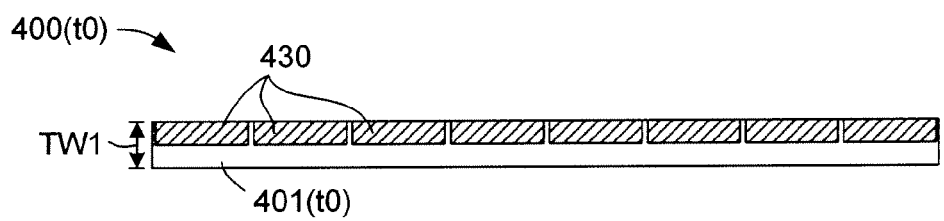
FIGS. 8(A), 8(B) and 8(C) are simplified cross-sectional side views depicting a process of grinding and dicing the wafer of FIG. 7 to produce IC dies.
Figure 8B:
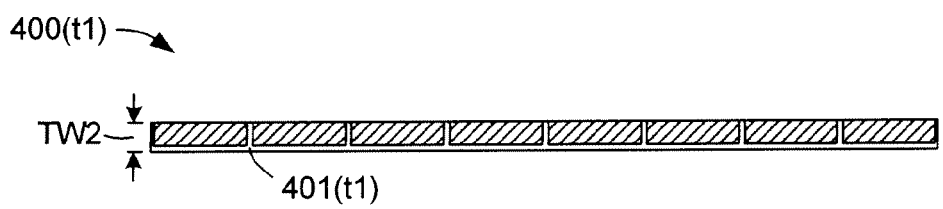

As indicated in FIGS. 8(A) and 8(B), during a wafer back grind process according to block 242 of FIG. 3, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 8(B), wafer 400(t1) has a pre-programmed thickness TW2 that is less than initial thickness TW1 (shown in FIG. 8(A)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 8C:
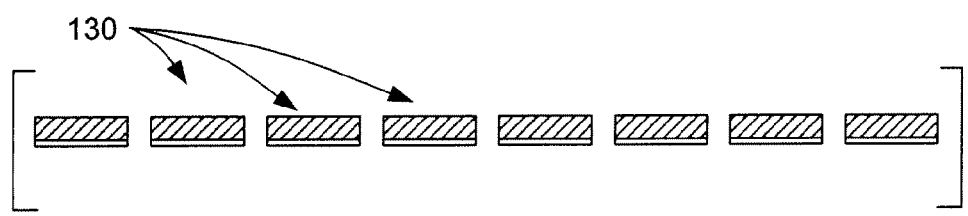

Next, as shown in FIG. 8(C), the wafer is diced (cut apart) along predefined border structures separating ICs 420 in order to produce IC dies 130 according to block 244 of FIG. 3. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 9:
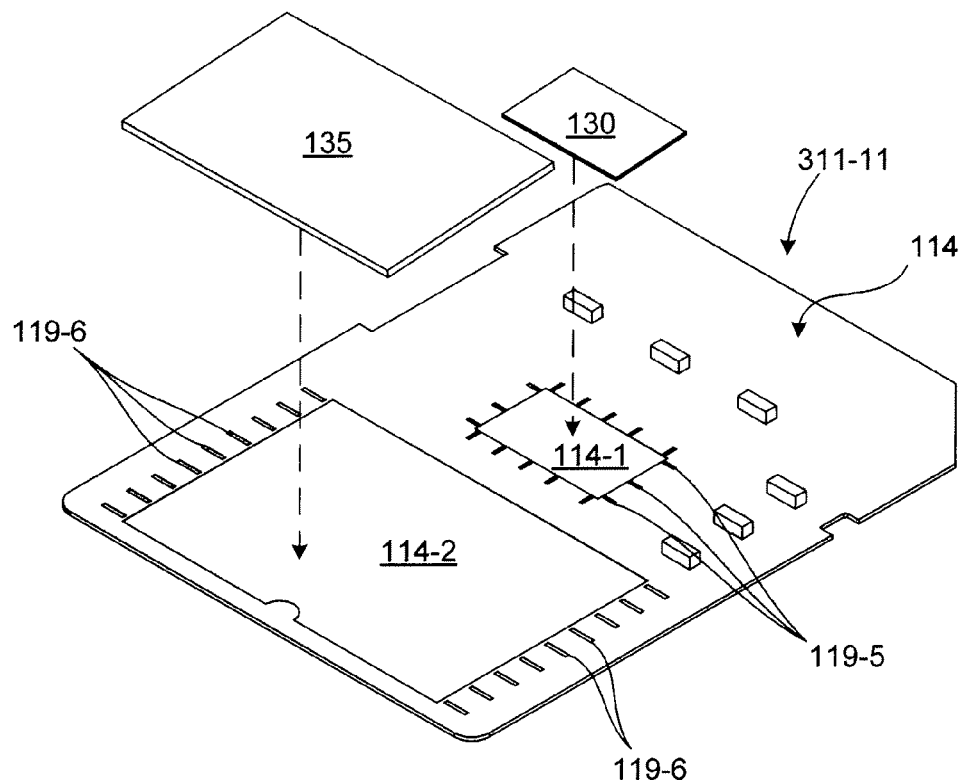
FIG. 9 is a perspective view depicting a die bonding process utilized to mount the IC dies of FIG. 8(C) on a PCB according to the method of FIG. 3.
Figure 10:
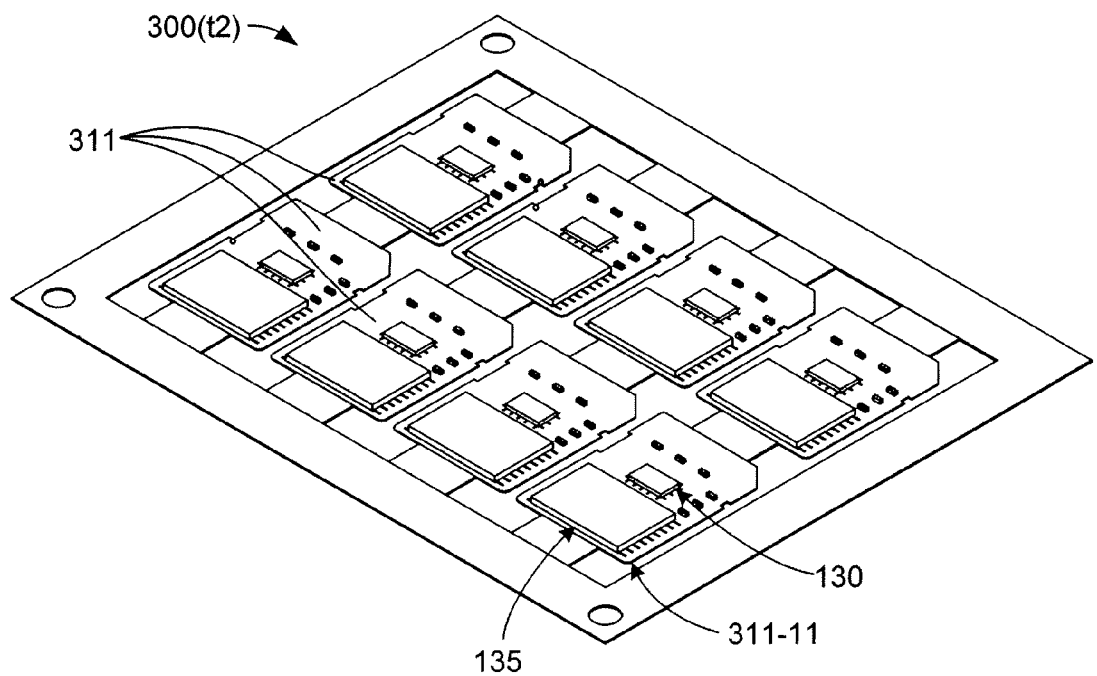
FIG. 10 is a top view showing the PCB panel of FIG. 6 after the die bonding process is completed.

FIG. 9 is a perspective view depicting a die bonding process utilized to mount controller IC dies 130 and flash memory IC die 135 of FIG. 8(C) onto PCB region 311-11 according to block 246 of FIG. 3. The die bonding process is performed on PCB panel 300(t1) (see FIG. 6), i.e., after completion of the SMT process. The die bonding process generally involves mounting controller IC dies 130 into lower surface region 114-1 of lower surface 114, which is bordered by contact pads 119-5, and mounting flash IC die 135 into lower surface region 114-2, which are surrounded by contact pads 119-6. In one specific embodiment, an operator loads IC dies 130 and 135 onto a die bonder machine according to known techniques. The operator also loads multiple PCB panels 300(t1) onto the magazine rack of the die bonder machine. The die bonder machine picks the first PCB panel 300(t1) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 114-1 and 114-2 of each of the PCB region 311 of PCB panel 300(t1). When all PCBs region 311 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 130 and bonds it onto area 114-1, where epoxy has already dispensed for the bonding purpose, and this process is then performed to place IC die 135 into region 114-2. Once all the PCB regions 311 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 10 is a top view showing PCB panel 300(t2) after the die bonding process is completed and controller IC 130 and memory IC die 135-1 and 135-2 are mounted onto each PCB region (e.g., PCB region 311-11).

Figure 11:
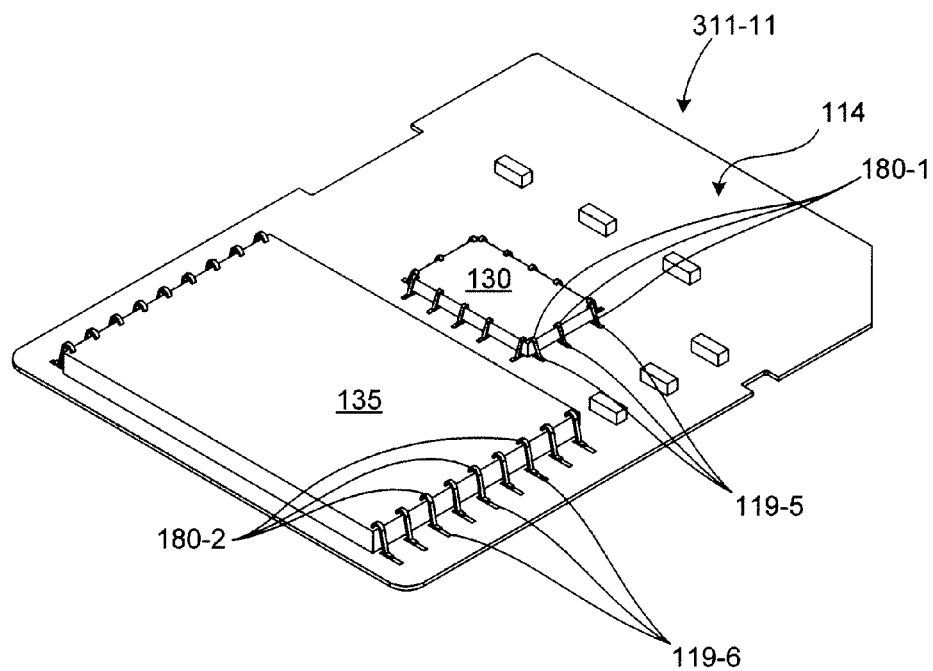
FIG. 11 is a perspective view depicting a PCB of the PCB panel of FIG. 10 after a wire bonding process is performed to connect the IC dies of FIG. 8(C) to corresponding contact pads disposed on a PCB according to the method of FIG. 3.
Figure 12:
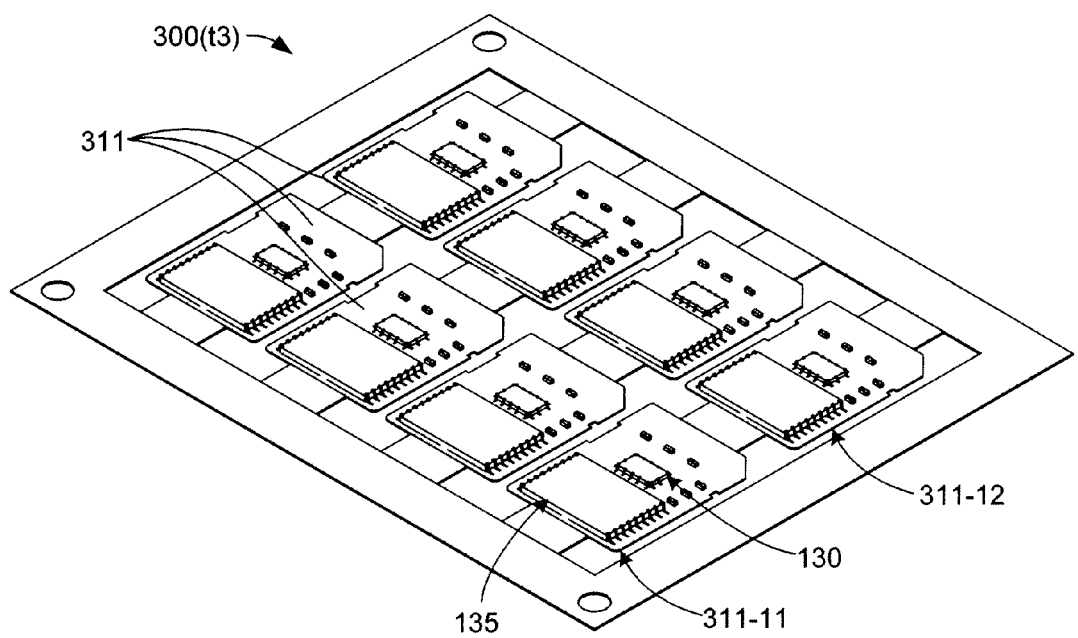
FIG. 12 is a top view showing the PCB panel of FIG. 10 after the wire bonding process is completed.

FIG. 11 is a perspective view depicting a wire bonding process utilized to connect the IC dies 130 and 135 to corresponding contact pads 119-5 and 119-6 of PCB region 311-11, respectively, according to block 248 of FIG. 3. The wire bonding process proceeds as follows. Once a full magazine of PCB panels 300(t2) (see FIG. 10) has completed the die bonding operation, an operator transports the PCB panels 300(t2) to a nearby wire bonder (WB) machine, and loads the PCB panels 300(t2) onto the magazine input rack of the WB machine. The WB machine is pre-prepared with the correct program to process this specific SD device. The coordinates of all the PCB contact pads 119-5 and 119-6 and PCB gold fingers were previously determined and programmed on the WB machine. After the PCB panel with the attached dies 130 and 135 is loaded at the WB bonding area, the operator commands the WB machine to use optical vision to recognize the location of the first wire bond pad of the first controller die 130 of PCB region 311-11 on the panel. A corresponding wire 180-1 is then formed between each wire bond pad of controller die 130 and a corresponding contact pad 119-5 formed on PCB region 311-11. Once the first pin is set correctly and the first wire bond 180-1 is formed, the WB machine can carry out the whole wire bonding process for the rest of controller die 130, and then proceed to forming wire bonds 180-2 between corresponding wire bond pads (not shown) on memory die 135 and contact pads 119-6 to complete the wire bonding of memory die 135. Upon completing the wiring bonding process for PCB region 311-11, the wire bonding process is repeated for each PCB region 311 of the panel. For multiple flash layer stack dies, the PCB panels may be returned to the WB machine to repeat wire bonding process for the second stack in the manner described below. FIG. 12 is a top view showing PCB panel 300(t3) after the wire bonding process is completed.

Figure 13A:
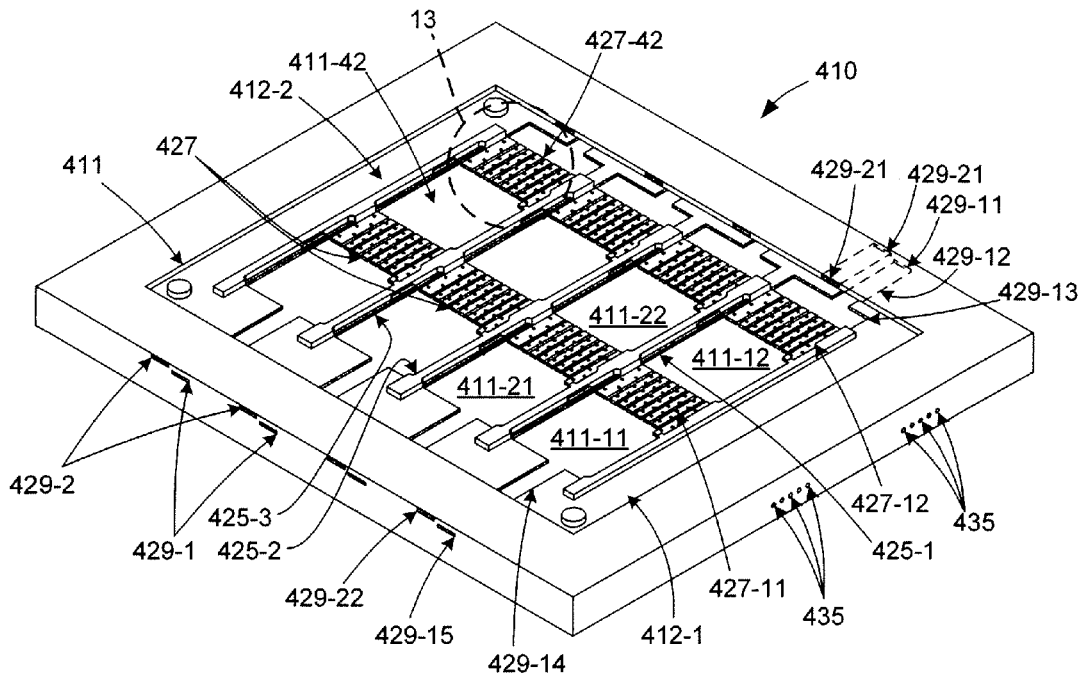
FIGS. 13(A) and 13(B) are perspective and enlarged partial perspective views showing a lower molding die according to the method of FIG. 3.
Figure 13B:
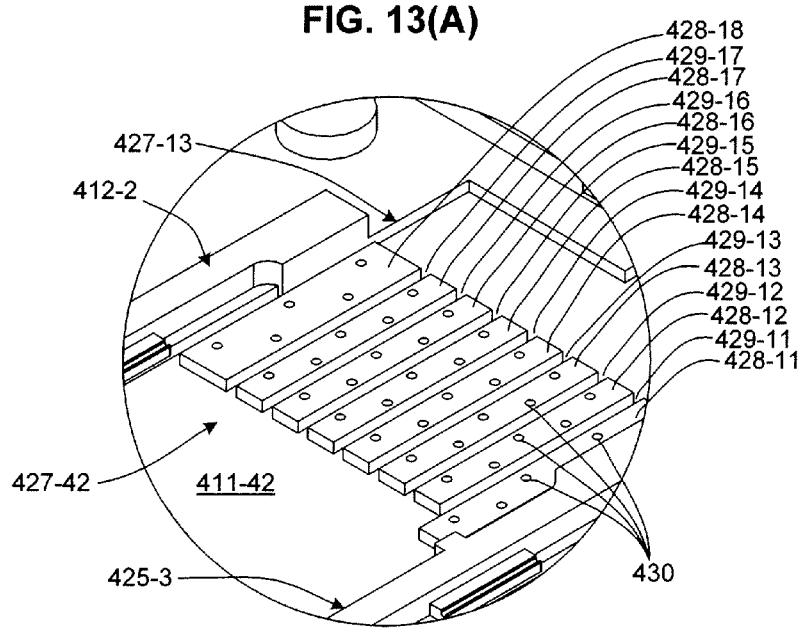

FIG. 13(A) is a perspective view showing a lower molding die 410 for receiving panel 300(t3) (see FIG. 12) during a plastic molding process according to block 250 of FIG. 3, which is utilized to encapsulate all components and void areas of the PCB regions. FIG. 13(B) is an enlarged perspective view showing circular region 13 of FIG. 13(A) in additional detail.

Figure 15:
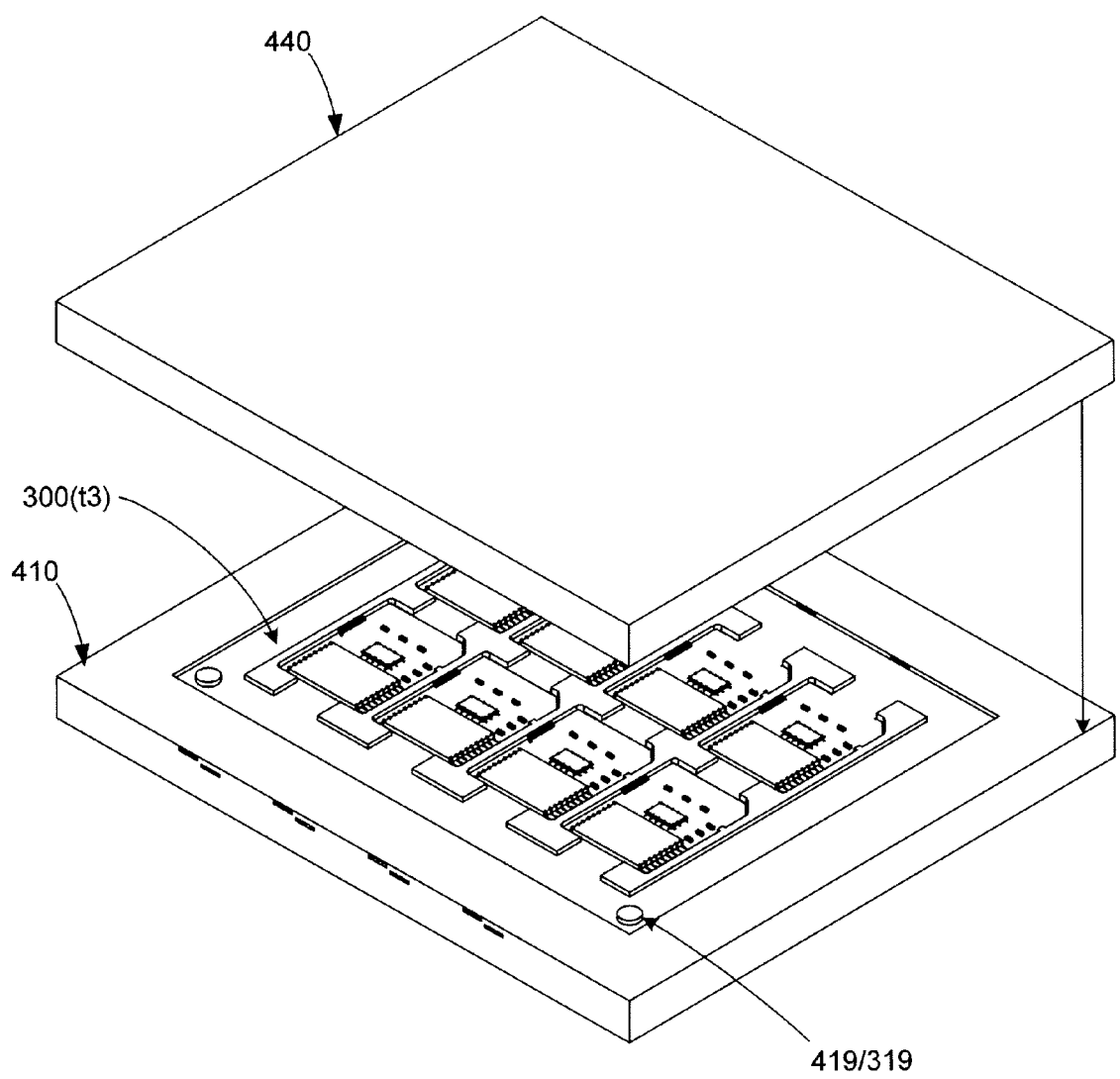
FIG. 15 is a perspective view showing the PCB panel of FIG. 12 mounted into the lower molding die of FIG. 13(A)

Referring to FIG. 13(A), lower die 410 defines a shallow cavity 411 that is partitioned by two raised end structures 412-1 and 412-2 and three raised dividing structures 425-1 to 425-3 into four channels, with each channel being further divided into two cavity regions that respectively receive a corresponding PCB region of panel 300(t3) (see FIG. 12) in the manner described below with reference to FIG. 15. For example, raised end structure 412-1 and raised dividing structure 425-1 form a first channel including cavity regions 411-11 and 411-12. Referring briefly to FIG. 15, cavity regions 411-11 and 411-12 respectively receive PCB regions 311-11 and 311-12 when panel 300(t3) is mounted onto lower molding die 410. Referring back to FIG. 13(A), raised end structures 412-1 and 412-2 and raised dividing structures 425-1 to 425-3 define the lateral side of the resulting SD cards when the molding process is complete.

As indicated in FIG. 13(A), run gate sets extend along each column on both (i.e., upper and lower) sides of each PCB region in order to facilitate the formation of molded plastic on both sides of panel 300(t3) (see FIG. 12). Each lower run gate set for each column is accessed by a pair of lower run gates 429-1, and each upper run gate set is accessed by an associated pair of upper run gate 429-2. For example, the lower run gate set for the column including cavity regions 411-11 and 411-12 includes an entry lower run gate 429-11, a first run channel 429-12 for conducting molten plastic into cavity region 411-12 by way of a buffering region 429-13, and a second run channel 429-12 leading from cavity region 411-11 to an exit lower run gate 429-14 for conducting molten plastic out of lower molding die 410. Buffer region 429-13, located between cavity region 411-12 and run channel 429-12, is an open area to buffer molten plastic compound before entering the cavity regions 411-11 and 411-12. Similarly, the upper run gate set for the column including cavity regions 411-11 and 411-12 includes a first (entry) upper run gate 429-21 and a second (exit) upper run gate 429-22, and corresponding channels (not shown) formed by an upper molding die (not shown) for forming molded material over the opposing surface of each PCB region.

As indicated in FIG. 13(A), each cavity region (e.g., regions 411-11 and 411-12) includes a contact support structure (e.g., 427-11 and 427-12) that serve to support the contact pads of each PCB region, and to facilitate forming the ribs separating the contact pads in the completed SD device. For example, as indicated in the enlarged view in FIG. 13(B), contact support structure 427-42 of contact region 411-42 includes a set of raised supports 428-11 to 428-18 that are separated by grooves 429-11 to 429-17. As plastic flows from buffer region 427-13 into cavity region 411-42, a portion of the molten plastic flows down each groove 429-11 to 427-17, thereby forming corresponding ribs of the completed device (e.g., ribs 155 shown in FIG. 1).

As indicated in FIG. 13(B), according to an aspect of the present invention, vacuum holes 430 are defined in each raised support 428-11 to 428-18 to hold the corresponding panel region against the upper surfaces of raised support 428-11 to 428-18 to provide tighter seal against the metal contacts in order to prevent bleed and flash of plastic materials from coating the metal contacts that can form an undesirable layer of insulating material. Referring to FIG. 13(A), vacuum holes 430 are connected to an external vacuum pump via vacuum channel openings 435, which are defined on the sides of lower molding die 410.

Figure 14A:
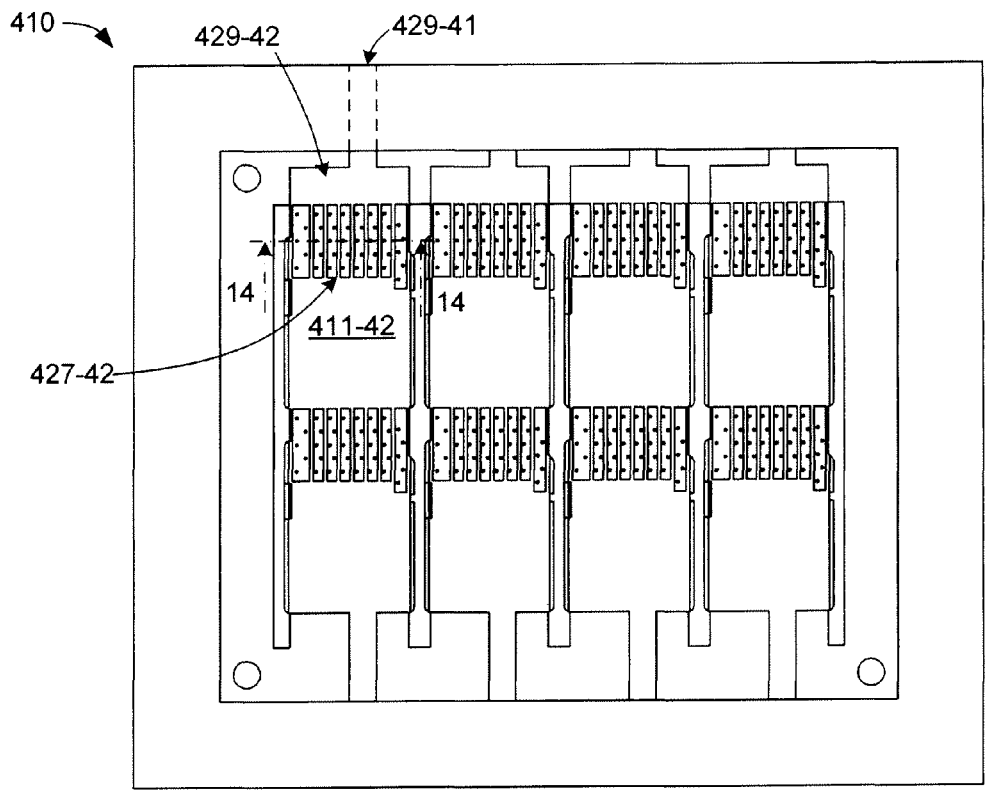
FIGS. 14(A) and 14(B) are top and cross-sectional side views showing the lower molding die of FIG. 13(A) in additional detail.
Figure 14B:
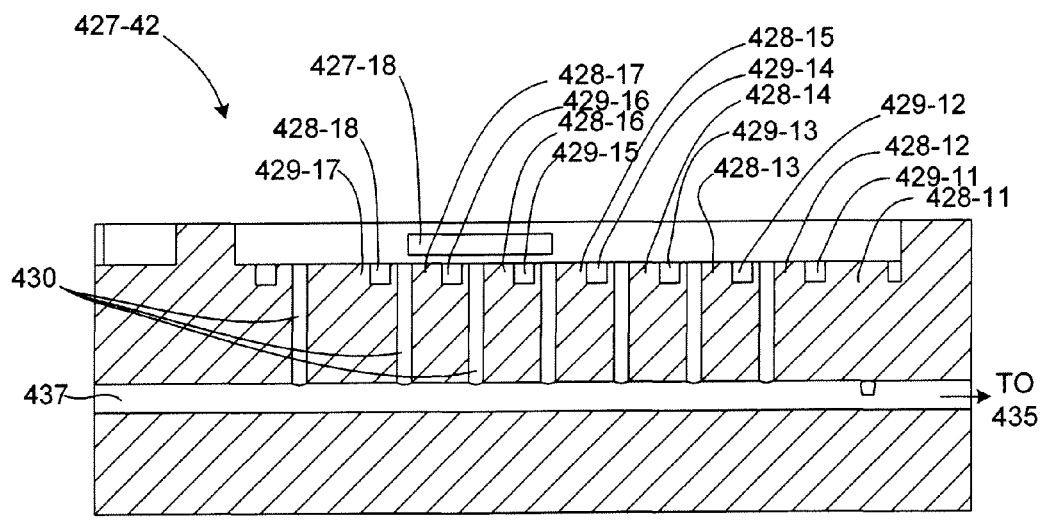

FIG. 14(A) is a top view of lower molding die 410, and FIG. 14(B) is a cross-sectional side view taken along line 14-14 of FIG. 14(A) showing contact support structure 427-42 in additional detail. Lower run gate 429-41 is located before the molten plastic compound buffer area 429-42. Transfer molding is prefer here due to the high accuracy of transfer molding tooling and low cycle time of process. Molten plastic compound is injected into the cavity region 422-42 through run gates 429-41, buffer region 429-42 and through grooves 429-11 to 427-17 of contact support structure 427-42. Vacuum holes 430 are connected to a larger diameter vacuum line 437, which is connected to the external vacuum pump (not shown) by way of vacuum channel openings 435 (shown in FIG. 13(A)).

Referring again to FIG. 13(A) and FIG. 15, lower die 410 includes three raised alignment poles 419 that are positioned to receive alignment holes 319 of PCB panel 300(*t*3) (see FIG. 12) in order to precisely align and snugly fit PCB panel 300(*t*3) into lower molding die 410, as indicated in FIG. 15. Each alignment pole 419 provided on lower molding die 410 is received inside a corresponding alignment hole 319 of panel 300(*t*3). In one embodiment, alignment poles 419 have a height that is not greater than the thickness of PCB panel 300. As indicated in FIG. 15, after PCB panel 300(*t*3) is aligned and secured in this manner, upper molding die 440 is lowered onto lower molding die 410 using known techniques.

Figure 16A:
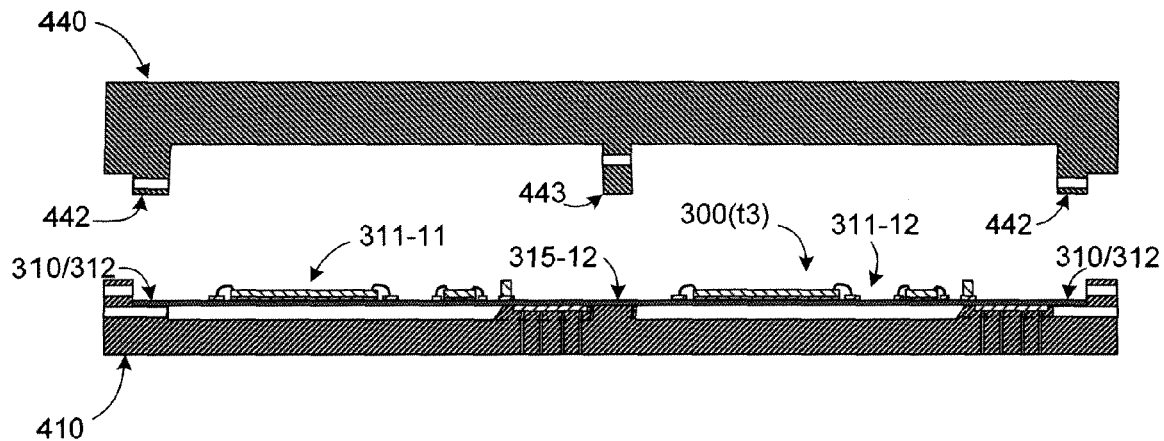
FIGS. 16(A), 16(B) and 16(C) are simplified cross-sectional side views depicting subsequent steps of assembling the molding die and injecting molten plastic according to the method of FIG. 3.
Figure 16B:
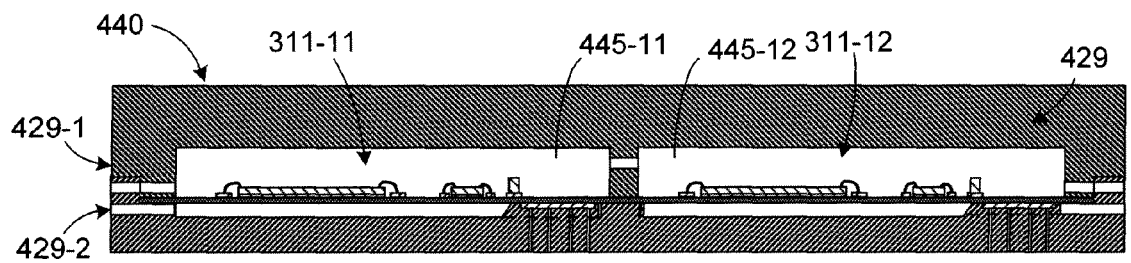
Figure 16C:
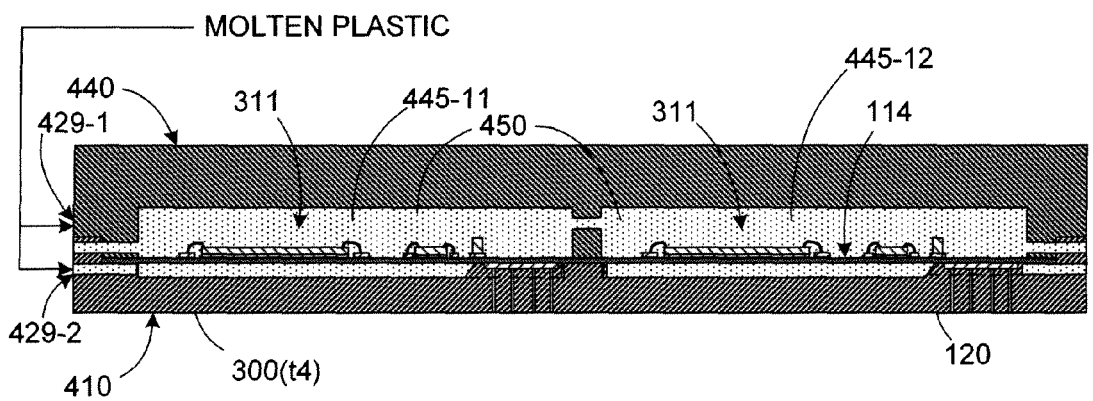

FIGS. 16(A), 16(B) and 16(C) are simplified cross-sectional side views depicting a molding process using molding dies 410 and 440. As indicated in FIGS. 16(A) and 16(B), after panel 300(*t*3) is loaded into lower molding die 410, upper molding die 440 is positioned over and lowered onto lower molding die 410 until peripheral raised surface 442 presses against corresponding peripheral end/side portions 310/312 of PCB panel 300(*t*3) surrounding PCB regions 311 and a central raised surface 423 presses against the central bridge pieces (e.g., bridge piece 315-12 located between PCB regions 311-11 and 311-12; see FIG. 4), thereby forming substantially enclosed chambers over each associated PCB region (e.g., as indicated in FIG. 16(B), chambers 445-11 and 445-12 are respectively formed over PCB regions 311-11 and 311-12). Referring again to FIG. 16(B), in accordance with another aspect of the invention, dual run gate (channel) sets 429-1 and 429-2 are provided for each associated pair of PCB regions 311 that facilitates the injection of molten plastic into chambers 445-11 and 445-12, as indicated in FIG. 16(C), whereby molded layer portions 450 are formed over lower surface 114 and upper surface 112 of each PCB region 311. From this point forward, the PCB panel is referred to as 300(*t*4).

FIG. 16(C) depicts the molding process. Transfer molding is prefer here due to the high accuracy of transfer molding tooling and low cycle time. The molding material in the form of pellet is preheated and loaded into a pot or chamber (not shown). A plunger (not shown) is then used to force the material from the pot through channel sets 429-1 and 429-2 (also known as a sprue and runner system) into the mold chambers 445-11 and 445-12, causing the molten (e.g., plastic) material to form molded casing regions 450 that encapsulates all the IC chips and components, and to cover all the exposed areas of lower surface 114 and upper surface 112. Note that, because the metal contacts of each PCB region 311 are pressed against corresponding support strips formed on lower molding die 410, no molding material is able to form on the metal contacts. The mold remains closed as the material is inserted and filled up all vacant areas of the mold die. During the process, the walls of upper die 440 are heated to a temperature above the melting point of the mold material, which facilitates a faster flow of material. The mold assembly remains closed until a curing reaction within the molding material is complete. A cooling down cycle follows the injection process, and the molding materials start to solidify and harden. Ejector pins push PCB panel 300(*t*4) (shown in FIGS. 16(C) and 17) from the mold machine once the molding material has hardened sufficiently.

Figure 17:
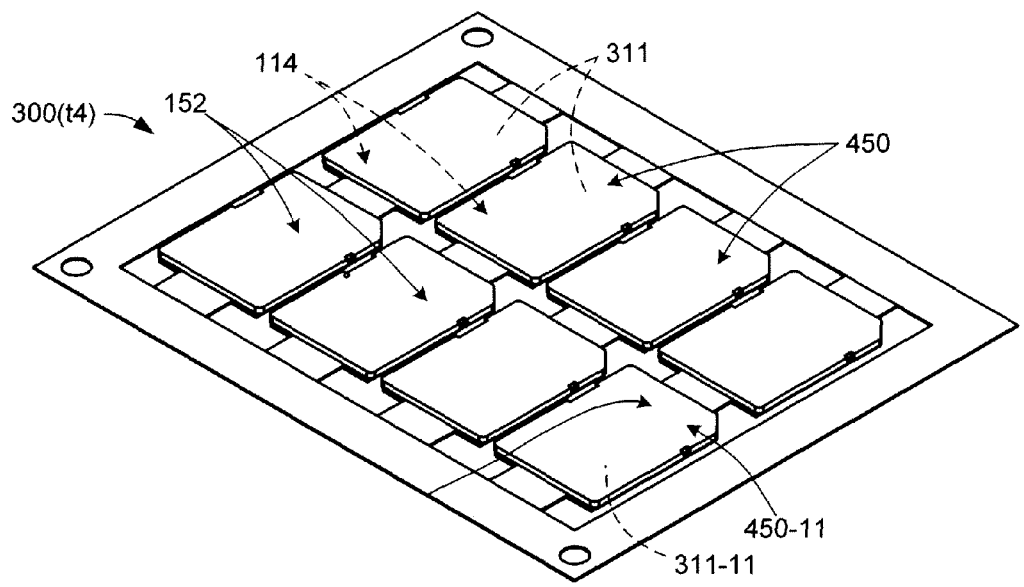
FIG. 17 is a perspective bottom view showing the PCB panel of FIG. 12 after the plastic molding process of FIGS. 16(A) to 16(C) is completed.

FIG. 17 is a perspective bottom view showing PCB panel 300(*t*4) after the plastic molding process of FIGS. 16(A) to 16(C) is completed. Panel 300(*t*4) includes eight molded casing regions 450, wherein each molded casing region extends over lower surface 114 of an associated PCB region 311 (e.g., molded casing region 450-11 extends over PCB region 311-11). Molded casing regions 450 are defined along each side by the side walls 153-1 and 153-2, and have a substantially flat "lower" surface 152.

Figure 18:
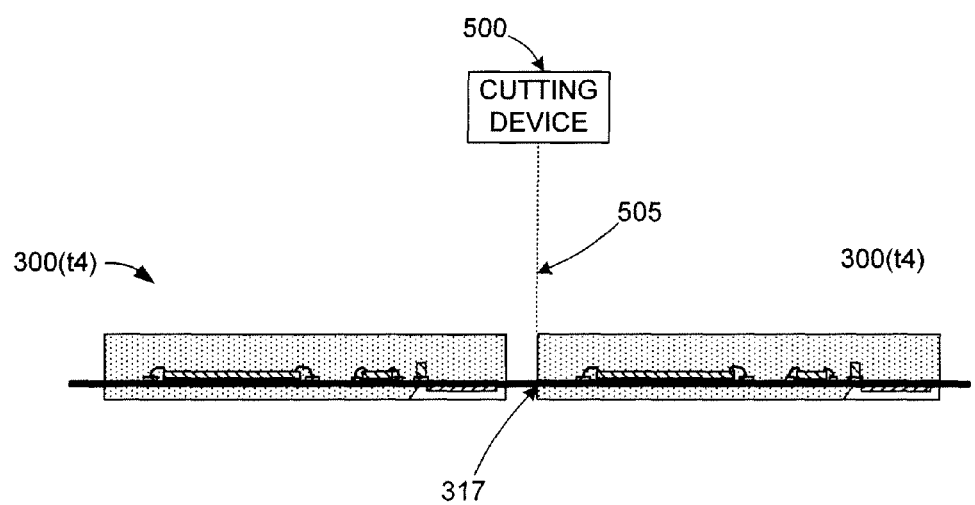
FIG. 18 is a simplified cross-sectional side view showing the panel of FIG. 17 during a direct singulation process according to an embodiment of the present invention.

Referring again to block 260 of FIG. 3 and to FIG. 18, a subsequent processing step involves singulating (separating) the over-molded PCB panel to form individual SD devices by cutting said PCB panel and said molded layer using one of a saw or another cutting device 500 (e.g., a laser cutter or a water jet cutter), thereby separating said PCB panel into a plurality of individual SD devices. As shown in FIG. 18, PCB panel 300(*t*4) is loaded into a saw machine 500 that is pre-programmed with a singulation routine that includes predetermined cut locations defined by designated cut lines 317. A saw blade 505 is aligned to the first cut line as a starting point by the operator. The coordinates of the first position are stored in the memory of the saw machine. The saw machine then automatically proceeds to cut up (singulate) panel 300(*t*4).

Figure 19B:
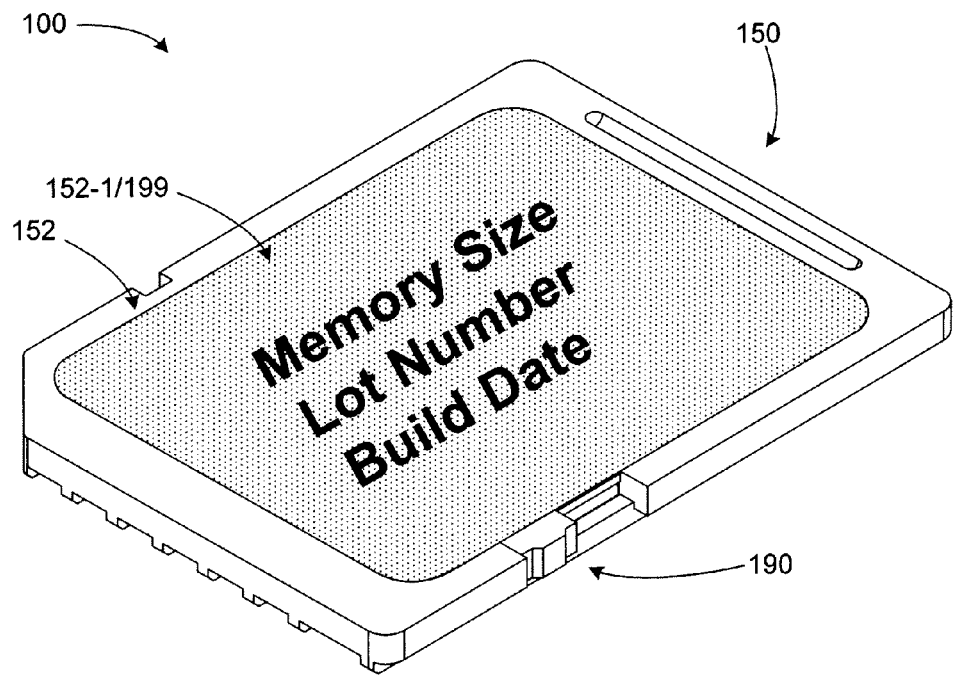

FIGS. 19(A) and 19(B) are perspective top and bottom views, respectively, showing a SD device 100 after singulation, with FIG. 19(A) depicting SD device after an insert-in assembly process is performed to attach write protect switch 190 to molded plastic casing 150 according to block 270 of the method of FIG. 3, and FIG. 19(B) depicting SD device 100 after a marking process is completed in accordance with block 275 of the method of FIG. 3. Referring to FIG. 19(A), the insert-in assembly process is performed using the procedure described above with reference to FIG. 1(A). Note that after the insert-in assembly process is completed, the outermost surface of switch cap 196 (i.e., the outer surface of flat wall portion 197, described above with reference to FIG. 1(A)) is coplanar with recessed wall section 152-1. SD device 100 then undergo a marking process in which a designated company's name/logo, speed value, density value, or other related information are printed on a label 199 that is attached to recessed wall section 152-1 of lower surface 152, as shown in FIG. 19(B). Note that label 199 covers the switch cap, which serves to further secure write protect switch 190 to molded plastic casing 150.

Referring to block 280 located at the bottom of FIG. 3, a final procedure in the manufacturing method of the present invention involves testing, packing and shipping the individual SD devices. The marked SD devices 100 shown in FIG. 19(B) are then subjected to visual inspection and electrical tests consistent with well established techniques. Visually or/and electrically test rejects are removed from the good population as defective rejects. The good memory cards are then packed into custom made boxes which are specified by customers. The final packed products will ship out to customers following correct procedures with necessary documents.

Figure 20A:
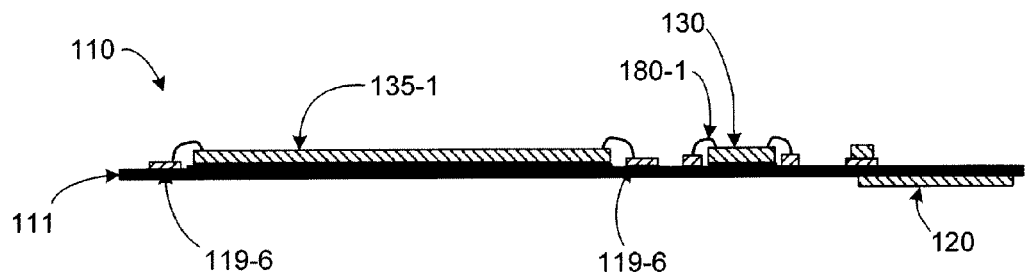
FIGS. 20(A), 20(B), 20(C), 20(D), 20(E) and 20(F) are simplified cross-sectional side views showing a PCB panel during a stacked-device assembly process according to an alternative embodiment of the present invention.
Figure 20B:
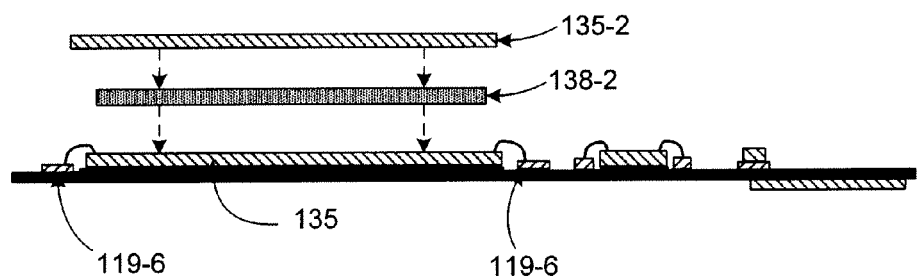
Figure 20C:
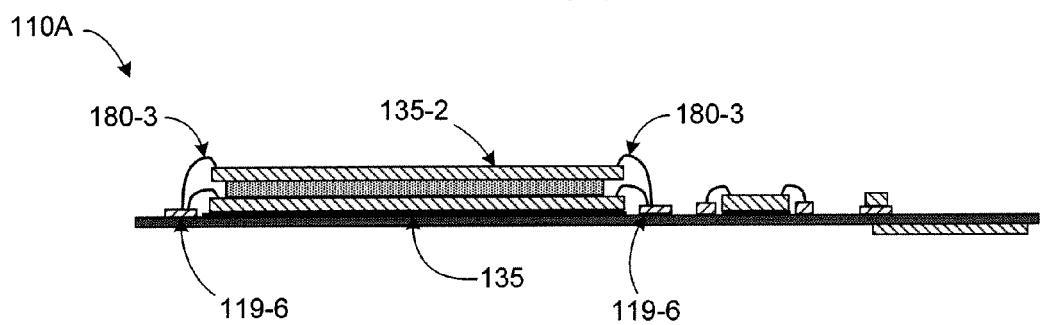
Figure 20D:
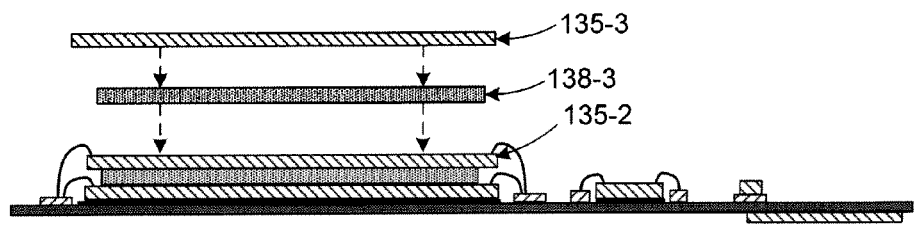
Figure 20E:
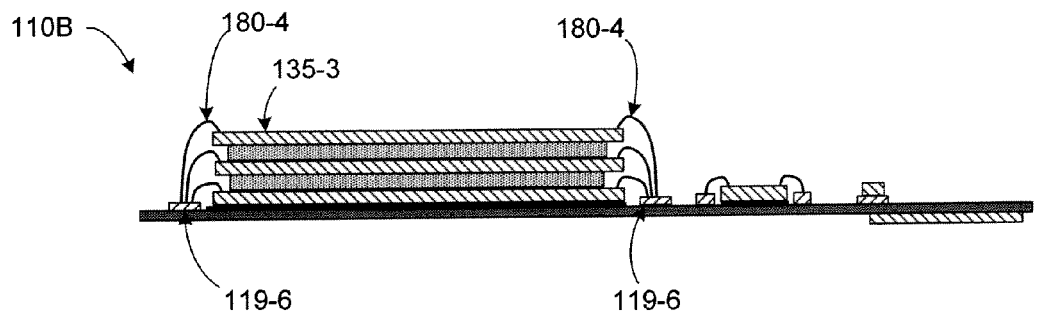
Figure 20F:
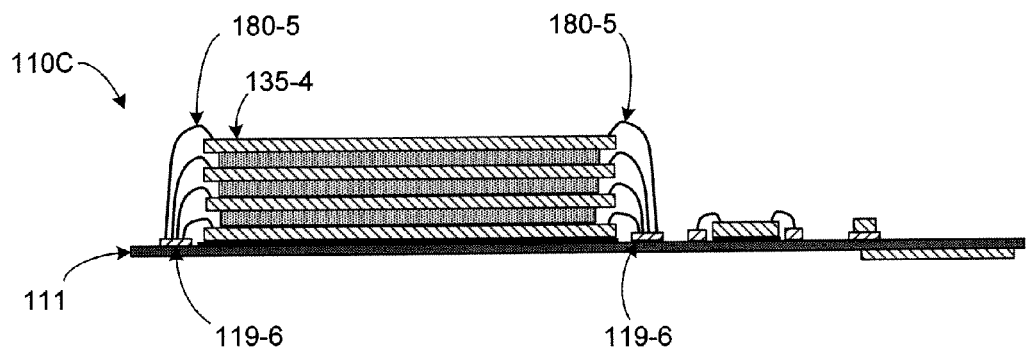
Figure 21:
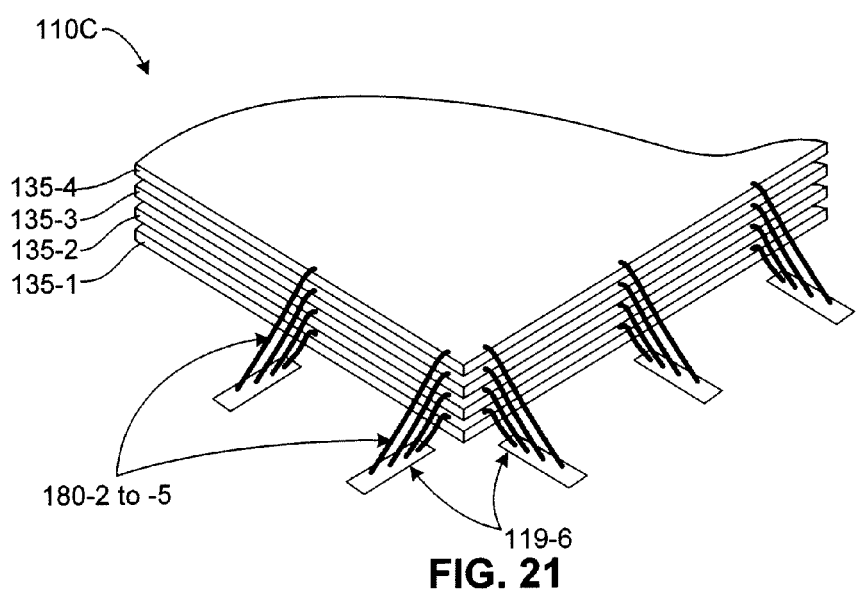
FIG. 21 is a partial perspective view showing a portion of the PCB panel of FIG. 20(F) after the stacked-device assembly process of FIGS. 20(A) to 20(F) is completed.

FIGS. 20(A)-20(F) are simplified cross-sectional side views showing a PCBA during a stacked-device assembly process according to an alternative embodiment of the present invention. For high memory size SD flash memory cards, this stacked die process is necessary to pack more than a single layer of flash memory die in the same package. Due to space limitations associated with the standard SD package size, stacking flash memory dies one on top of the other is used to achieve the high memory size requirement. One or more iterations of looping between die bond and wire bond processes are used to achieve the desire memory size final SD memory card. This die bond and wire bond looping process is briefly illustrated in FIGS. 20(A) to 20(F). FIG. 20(A) shows PCBA 110 after a first wire bonding process is performed to connect controller IC die 130 to PCB 111 using wire bonds 180-1, and to connect memory IC die 135 to PCB 111 using wire bonds 180-2, as described above with reference to PCB panel 300(*t*3) (see FIGS. 11 and 12). Next, as shown in FIG. 20(B), tape glue 138-2 is applied to the top of die 135, and a second memory IC die 135-2 is attached to die 135. As shown in FIG. 20(C), memory IC die 135-2 is then wire bonded to contact pads 119-6 by way of wire bonds 180-3, thereby forming intermediate PCBA 110A. Next, as shown in FIG. 20(D), tape glue 138-3 is applied to the top of die 135-2, and a third memory IC die 135-3 is attached to die 135-2. As shown in FIG. 20(E), memory IC die 135-3 is then wire bonded to contact pads 119-6 by way of wire bonds 180-4, thereby forming intermediate PCBA 110B. Finally, as shown in FIG. 20(F), tape glue is again applied, a fourth memory IC die 135-4 is attached, and then wire bonded to contact pads 119-6 by way of wire bonds 180-5, thereby forming PCBA 110C. FIG. 21 is a partial perspective view showing a portion of PCBA 110C of FIG. 20(F) including the multiple-layered die-stack made up of memory IC die 135-1, 135-2, 135-3 and 135-4, which are connected to associated contact pads 119-6 by way of wire bonds 180-2 to 180-5.

Figure 22A:
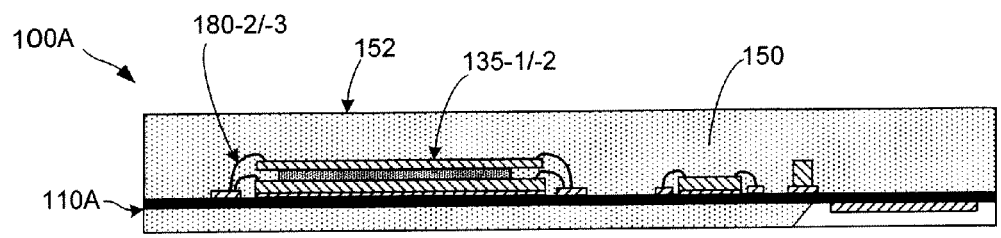
FIGS. 22(A), 22(B) and 22(C) are cross-sectional side views showing various SD devices including different numbers of stacked memory devices according to alternative embodiments of the present invention.
Figure 22B:
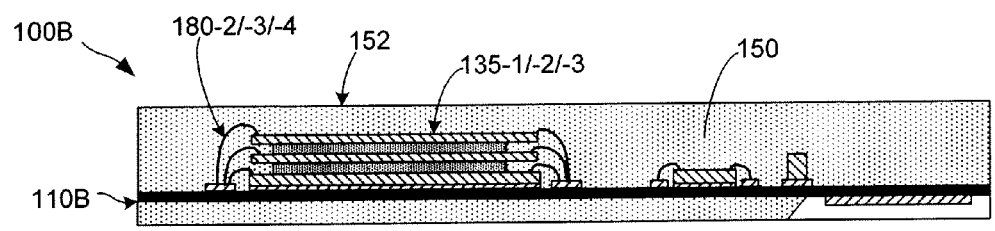
Figure 22C:
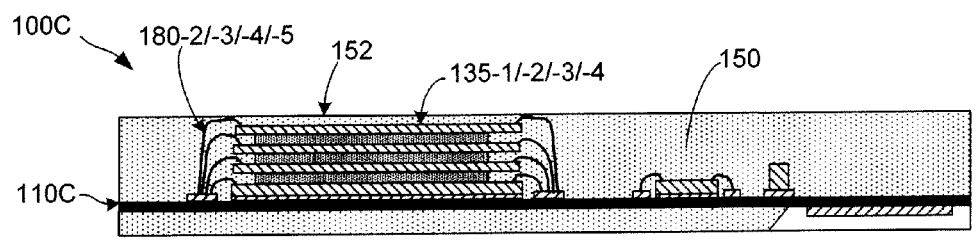

FIGS. 22(A), 22(B) and 22(C) are cross-sectional side views showing various SD devices 100A, 100B and 100C, respectively, which include different numbers of stacked memory devices according to alternative embodiments of the present invention. FIG. 22(A) shows a SD device 100A, which includes intermediate PCBA 110A (described above with reference to FIG. 20(C)) after the molding process in which molded casing 150 formed over memory IC die 135-1 and 135-2 and associated wire bonds 180-2 and 180-3. Similarly, FIG. 22(B) shows a SD device 100B, which includes intermediate PCBA 110B (described above with reference to FIG. 20(E)) after the molding process in which molded casing 150 is formed over memory IC die 135-1 to 135-3 and associated wire bonds 180-2 to 180-4. Finally, FIG. 22(C) shows a SD device 100C, which includes PCBA 110C (described above with reference to FIG. 20(F)) after the molding process in which molded casing 150 is formed over memory IC die 135-1 to 135-4 and associated wire bonds 180-2 to 180-5. Note that in each of SD devices 100A to 100C (FIGS. 20(A) to 20(C), upper surface 152 of molded casing 150 is disposed over the uppermost memory IC die and associated wire bonds, whereby the present invention facilitates the production of SD devices having a variety of storage capacities with minimal changes to the production process (i.e., simply changing the number of memory die layers changes the memory capacity).

Figure 23:
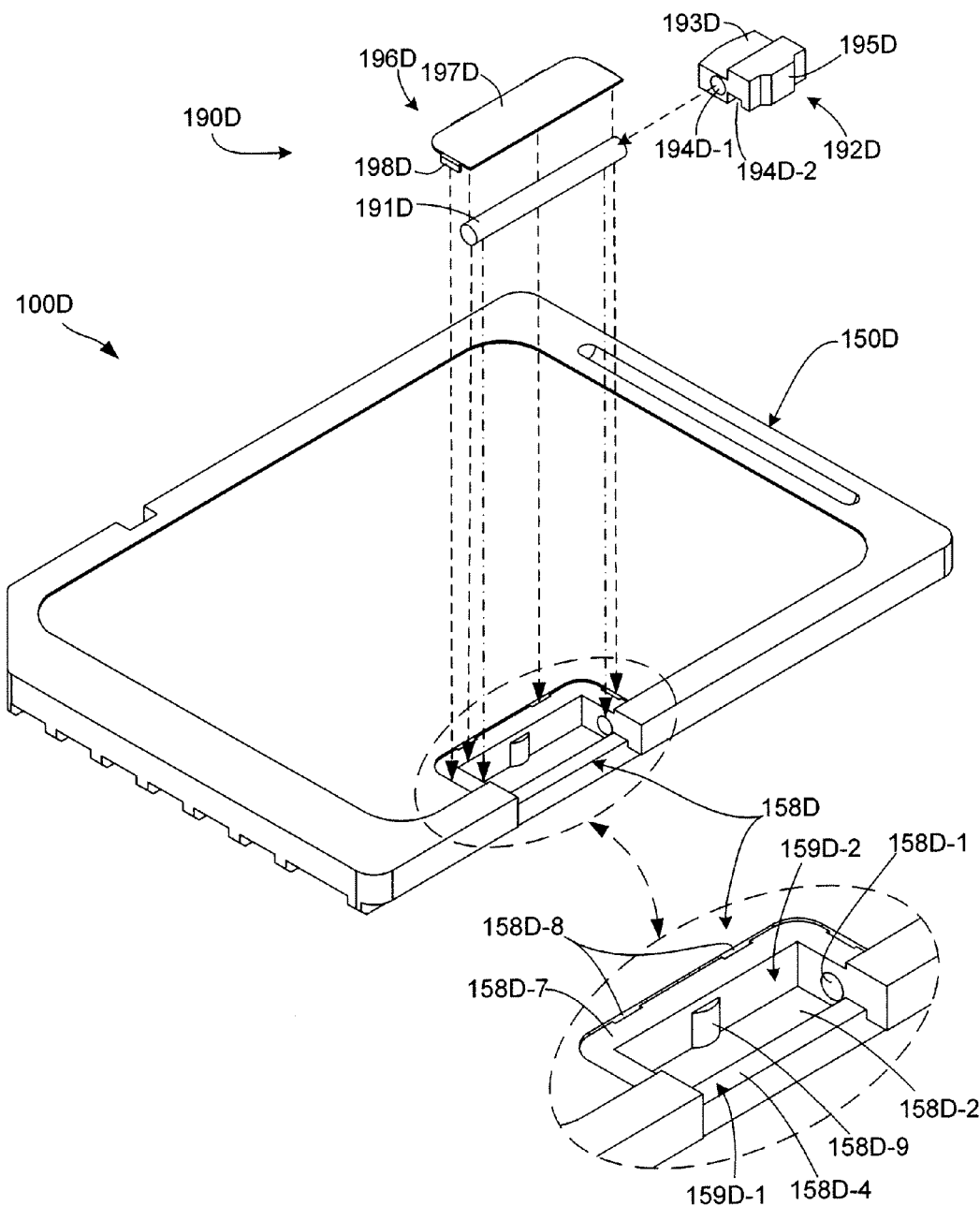
FIG. 23 is a partially exploded perspective top view showing an SD device produced in accordance with an alternative embodiment of the present invention.
Figure 24:
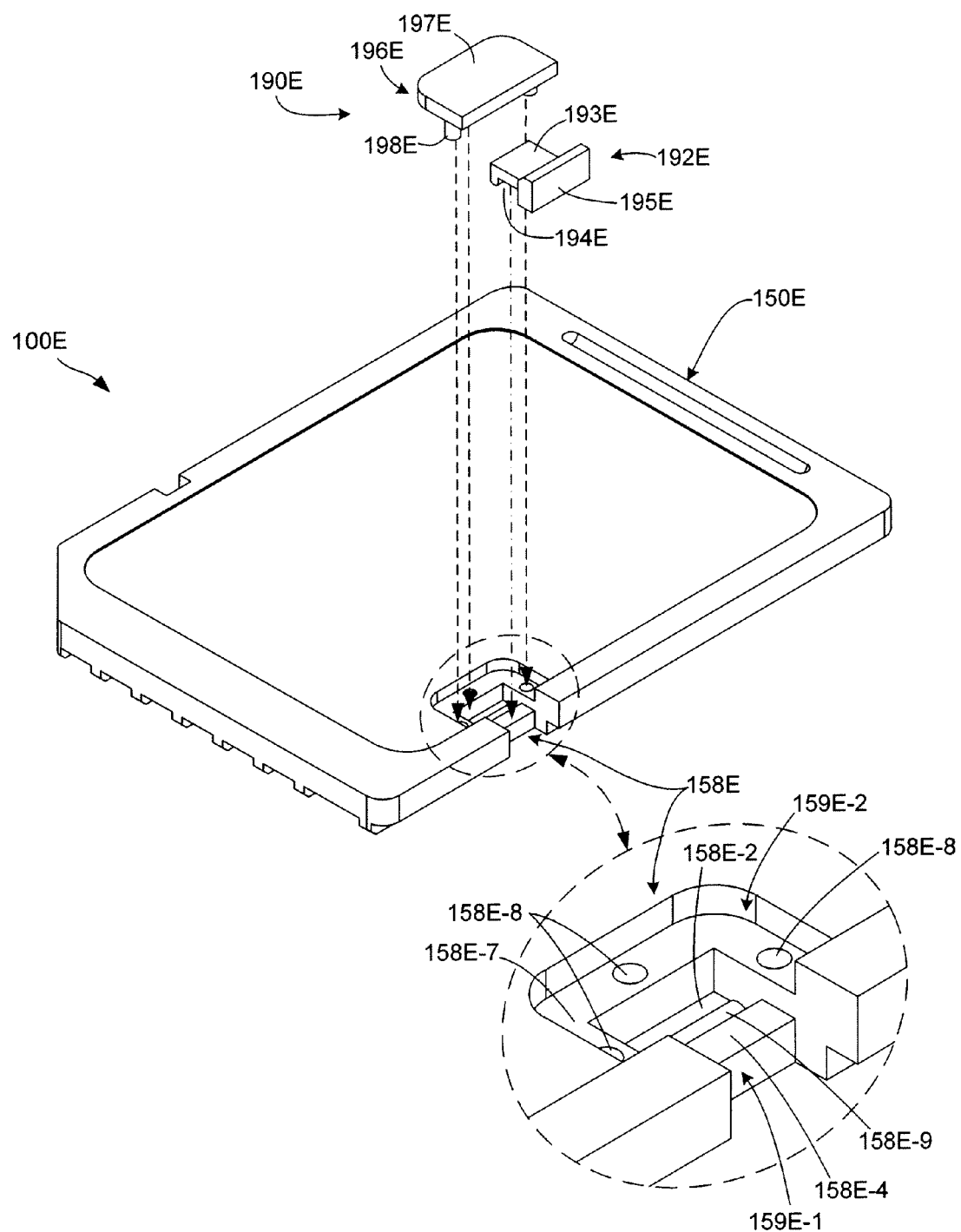
FIG. 24 is a partially exploded perspective top view showing an SD device produced in accordance with an alternative embodiment of the present invention.

FIGS. 23 to 25 illustrate SD/MMC cards according to alternative embodiments of the present invention.

FIG. 23 is a partial exploded perspective view depicting an SD device 100D according to a first alternative embodiment. Device 100D includes a plastic molded casing 150D that is substantially the same as casing 150 (described above), but includes a pre-molded switch slot 158D that differs as described below, and SD device 100D also includes a write protect switch assembly 190D that differs from switch assembly 190 in the manner described below. Other features of device 100D are essentially identical to those of SD device 100, and are therefore omitted below for brevity.

Referring to the upper portion of FIG. 23, write protect switch assembly 190D includes a switch button 192D that is formed by known plastic molding techniques, a metal switch cap 196D, and a metal rod 191D. Similar to the embodiment described above, switch button 192D includes a base portion 193D that defines a through-hole 194D-1, and a button top 195D that defines a retaining slot 194D-2. Switch cap 196D includes a flat wall portion 197D, and four metal hooks (protrusions) 198D extending downward from a lower surface of flat wall portion 197D. Referring to the lower portion of FIG. 23, pre-molded switch slot 158D includes an elongated cavity 158D-2 that is defined in casing 150D and is exposed by a side (first) opening 159D-1 and by a bottom (second) opening 159D-2. Pre-molded switch slot 158D also includes two openings 158-D1 disposed at opposite ends of elongated cavity 158D-2, a retention wall 158D-4, a support shelf 158D-7, four retention slots (openings) 158D-8 that extend downward into support shelf 158D-7, and a positioning bump 158D-9, all of which function substantially the same as the like-references counterpart elements of SD device 100, described above, except as set forth below.

The low-cost insert-in assembly process associated with SD device 100D is performed as follows. First, as indicated by the horizontal arrow at the top of FIG. 23, switch button 192D is mounted onto metal rod 191D, and then as indicated by the vertical dash-dot-line arrows, the assembly is mounted onto casing 150D such that opposing ends of metal rod 191 are received in openings 158D-1 (one end of metal rod 191D is inserted into one of openings 158D-1, the metal rod 191D is bent to insert the other end into the second opening), and such that retention wall 158D-4 is slidably received inside slot 194D-2. Next, switch cap 196D is mounted onto casing 150 by inserting metal hooks 198D into retention slots 158D-8. Note that metal hooks 198D are self-engaged inside slots 158-8, thereby simplifying the assembly process. Once the assembly process is completed, SD device 100D looks and operates substantially as described above with reference to device 100.

FIG. 24 is a partial exploded perspective view depicting an SD device 100E according to a first alternative embodiment. Device 100E includes a plastic molded casing 150E that is substantially the same as casings 150 and 150D (described above), but includes a pre-molded switch slot 158E that differs as described below, and SD device 100E also includes a push-pull-type write protect switch assembly 190E that differs from switch assembly 190 in the manner described below. Other features of device 100E are essentially identical to those of SD device 100, and are therefore omitted below for brevity.

Referring to the upper portion of FIG. 24, write protect switch assembly 190E includes a switch button 192E and a switch cap 196E that are formed by known plastic molding techniques. Similar to the embodiment described above, switch button 192E includes a base portion 193E and a button top 195E that defines a retaining slot 194E. Switch cap 196E includes a flat wall portion 197E, and four poles (protrusions) 198E extending downward from a lower surface of flat wall portion 197E. Referring to the lower portion of FIG. 24, pre-molded switch slot 158E includes a cavity 158E-2 that is defined in casing 150E and is exposed by a side (first) opening 159E-1 and by a bottom (second) opening 159E-2. Pre-molded switch slot 158E also includes a retention wall 158E-4, a support shelf 158E-7, three retention holes (openings) 158E-8 that extend downward into support shelf 158E-7, and a positioning bump 158E-9, all of which function similar to the like-references counterpart elements of SD device 100, described above, except as set forth below.

Figure 25A:
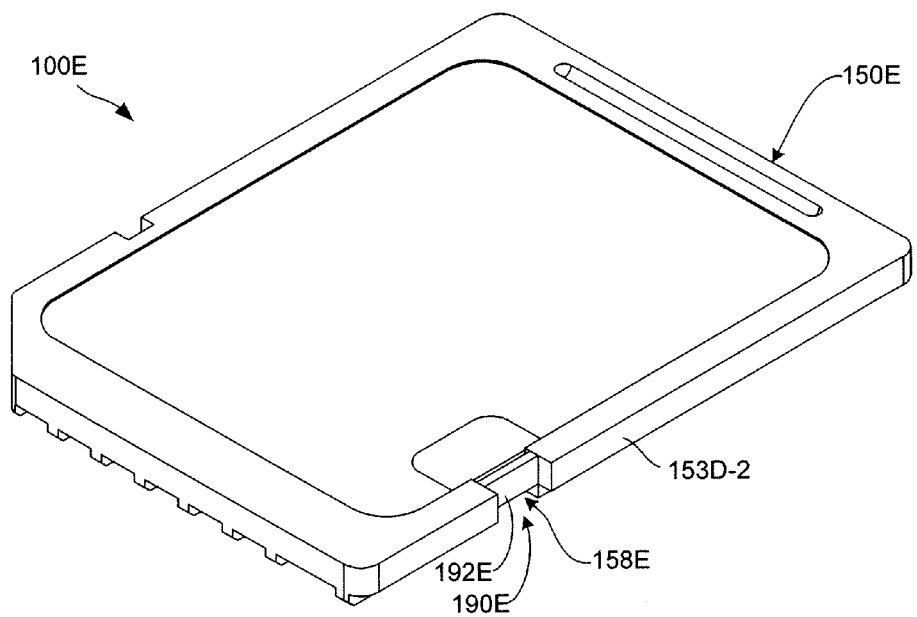
FIGS. 25(A) and 25(B) are assembled perspective top views showing the SD device of FIG. 24 in alternative operating states.
Figure 25B:
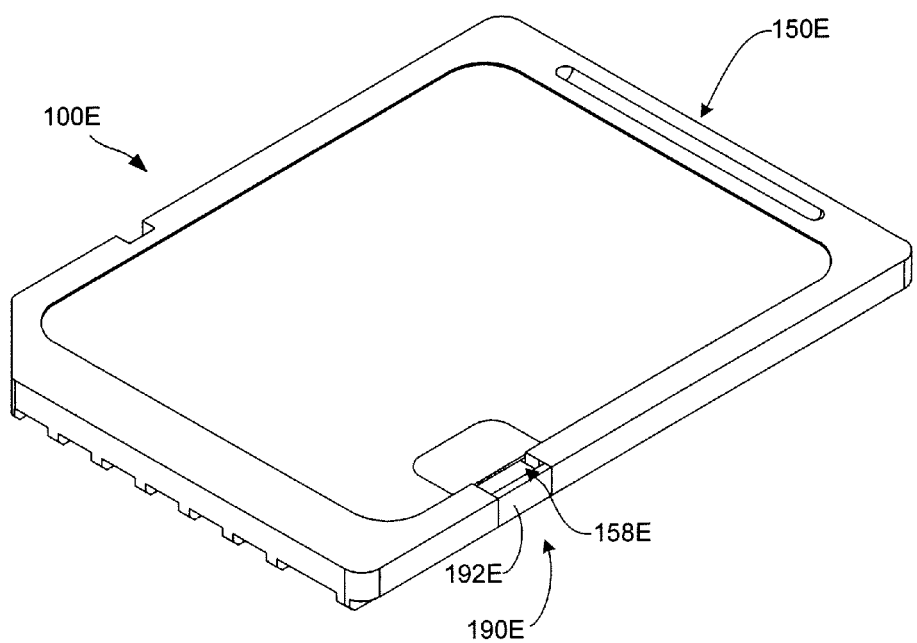

The low-cost insert-in assembly process associated with SD device 100E is performed as follows. First, as indicated by the vertical dash-dot-line arrow, switch button 192E is mounted onto casing 150E retention wall 158E-4 is received inside slot 158-E2. Next, switch cap 196E is mounted onto casing 150 by inserting poles 198E into retention holes 158E-8. FIGS. 25(A) and 25(B) show SD device 100E after the assembly process is completed. As indicated in these figures, write protect switch assembly 190E operates by pushing/pulling button top 192E in a direction perpendicular to side wall 153D-2 of casing 150E, with FIG. 25(A) showing button top 192E in a retracted "write protect" or "read only" position, and FIG. 25(B) showing button top 192E in a deployed "write allowed" position.

Figure 26:
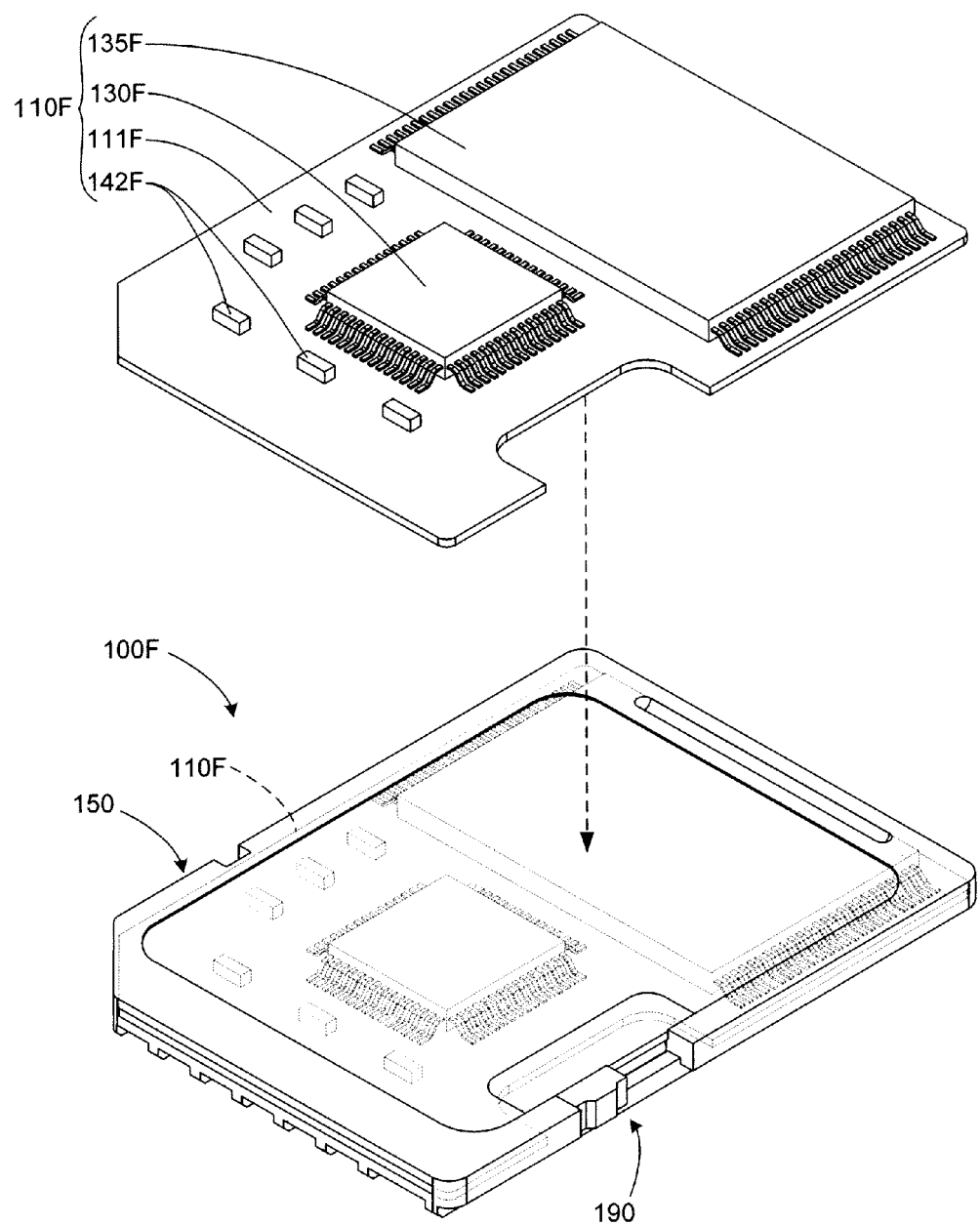
FIG. 26 is a perspective top view showing an SD device produced in accordance with an alternative embodiment of the present invention.
Figure 27:
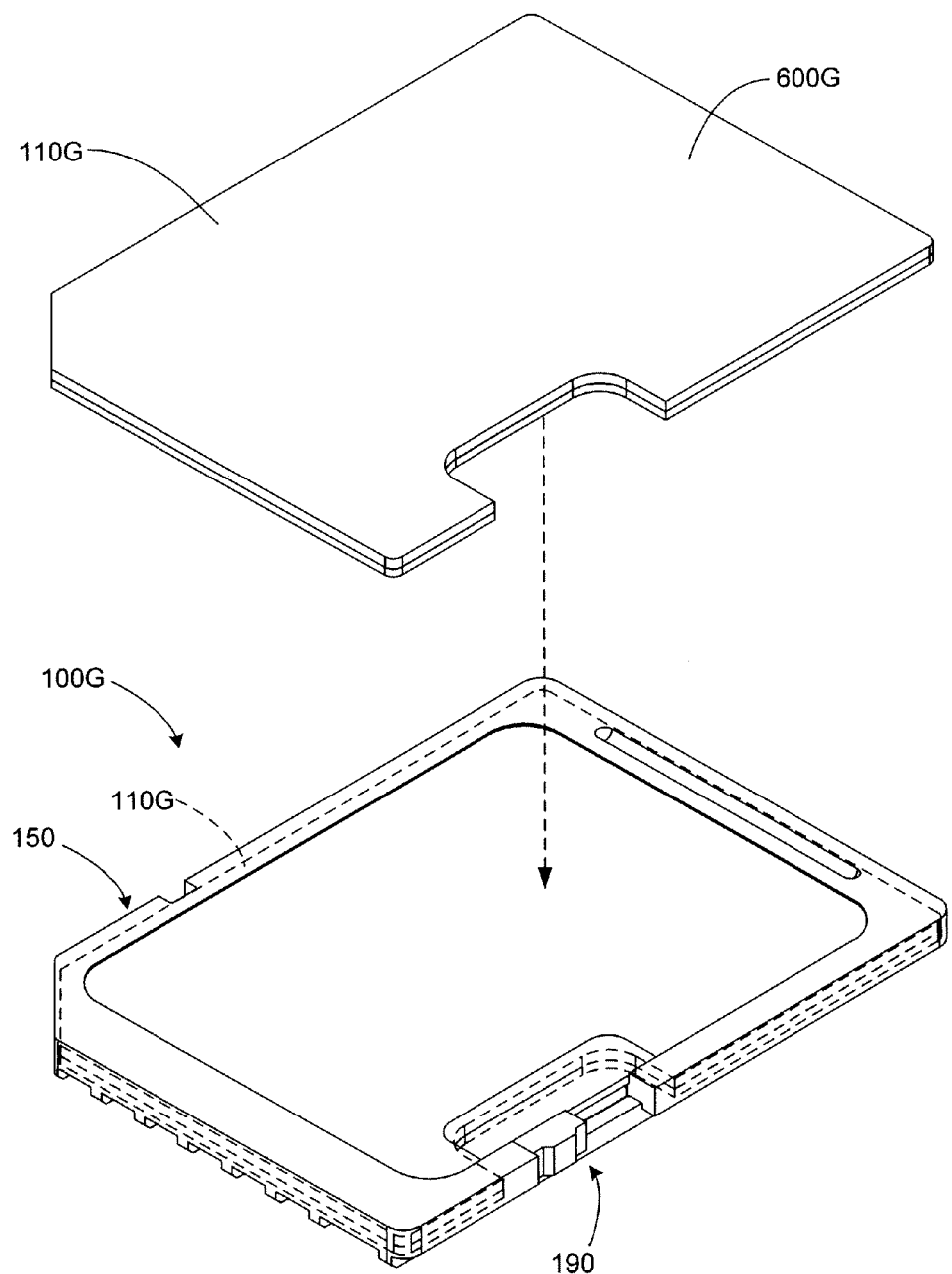
FIG. 27 is a perspective top view showing an SD device produced in accordance with another alternative embodiment of the present invention.
Figure 28:
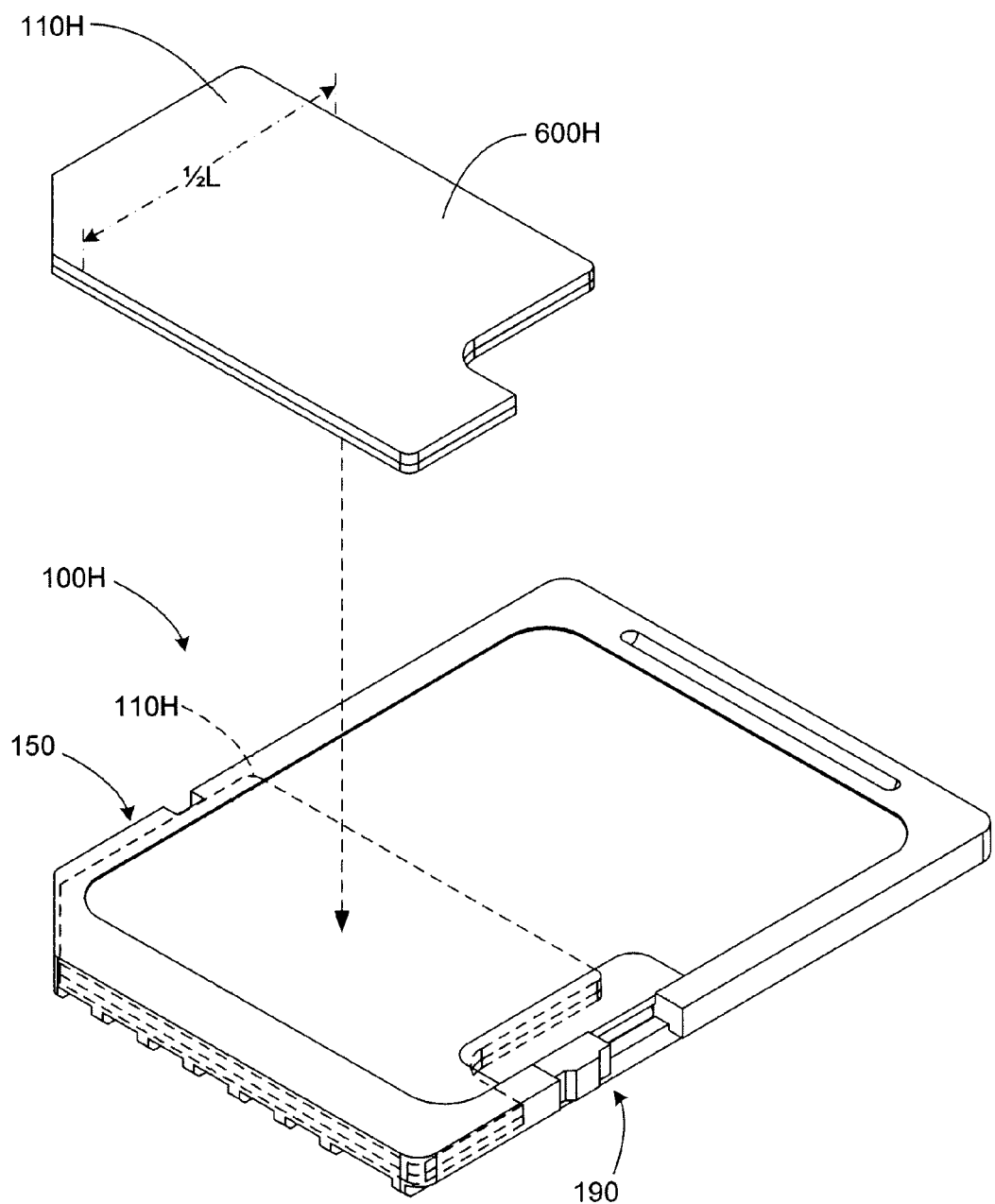
FIG. 28 is a perspective top view showing an SD device produced in accordance with another alternative embodiment of the present invention.
Figures 29A, 29B:
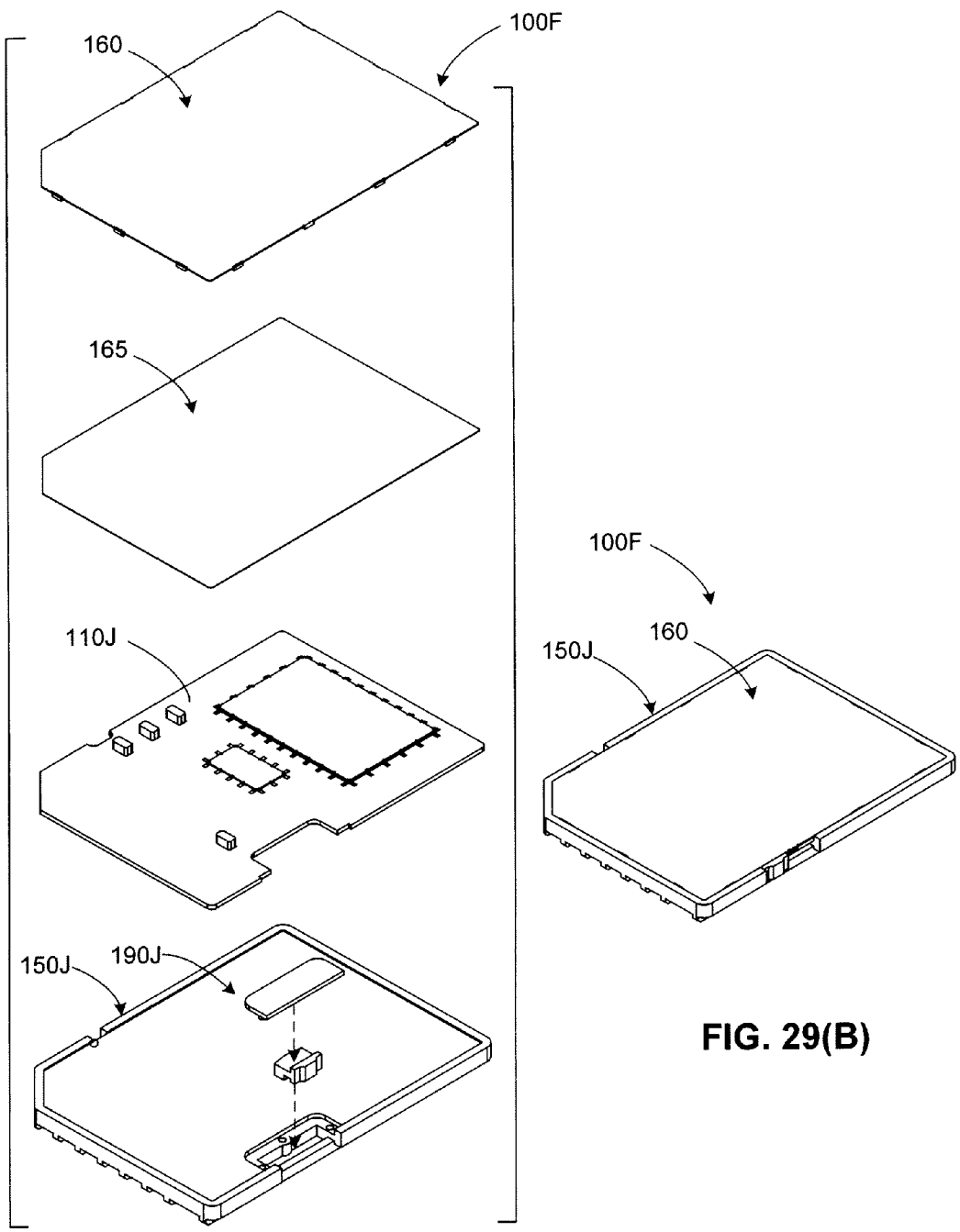
FIGS. 29(A) and 29(B) are exploded perspective and assembled perspective views showing an SD device produced in accordance with another alternative embodiment of the present invention.

Although the present invention has been described with respect to certain specific embodiments, it will be clear to those skilled in the art that the inventive features of the present invention are applicable to other embodiments as well, all of which are intended to fall within the scope of the present invention. For example, the single-shot molded casing and write protect switch assembly associated with the present invention may be modified according to known methods to produce MMC devices (or other similar flash memory devices). Further, the single-shot molding process and write protect switch assembly process described above may be utilized to form SD, MMC or other flash memory devices utilizing non-COB manufacturing techniques. For example, FIG. 26 shows an SD (memory card) device 100F according to an alternative embodiment which the active components (e.g., flash memory and controller) are fully packaged and mounted onto the PCB using only SMT techniques. Device 100F includes a PCBA 110F having a thin small-outline package (TSOP) flash device 135F, a similarly packages controller device 130F, and passive components 142F that are mounted on a PCB 111F using standard SMT fabrication processes. PCBA 110F is then processed in a manner similar to that described above to produce device 100F, which includes a plastic molded casing 150 and a write protect switch assembly 190 that are formed and assembled using any of the related processes described above. FIG. 27 shows an SD (memory card) device 100G according to an alternative embodiment which the active components are encased in a transfer molded casing 600G prior to being encased inside an injection molded housing 150 and being equipped with a write protect switch 190 according to the various embodiments described herein. FIG. 28 shows another SD device 100H according to an alternative embodiment which the active components are encased in an approximately half-length transfer molded casing 600H (e.g., where the length of casing 600H is ½-L, where L is the standard SD length described above with reference to FIG. 1(B)). Casing 600H is then encased inside an injection molded housing 150 and equipped with a write protect switch 190 according to the various embodiments described herein. Although devices formed using these alternative approaches may exhibit reduced storage capacity, i.e., in comparison to devices produced by the COB techniques described herein, these devices illustrate the flexibility of the molded casing concept in that substantially the same mold may be used to form each of these devices, thereby minimizing manufacturing costs while maximizing manufacturing flexibility. In another alternative embodiment, FIGS. 29(A) and 29(B) show another SD device 100J according to an alternative embodiment which a metal sheet 160 is mounted over PCBA 110J with an insulating sheet 165 disposed therebetween, wherein metal sheet 160 is integrally molded with or otherwise secured (e.g., by snap coupling) to casing 150J such that metal sheet 160 is disposed on the outside surface of housing 150J, and serves both as parasitic electromagnetic wave shielding and for aesthetic value. Note that a write protect switch assembly 190J is secured to housing 150J in the manner described above.

The invention claimed is:

1. A memory card device comprising:
a printed circuit board assembly (PCBA) including:
a printed circuit board (PCB) having opposing first and second surfaces, the printed circuit board (PCB) including,
a plurality of metal contacts mounted on the first surface of the PCB and connected to corresponding conductive traces,
at least one passive component surface mounted on a selected one of the first and second surfaces of the PCB,
at least one integrated circuit (IC) device mounted on said selected one of the first and second surfaces of the PCB;
an integral molded plastic casing comprising thermoset plastic and including an upper wall formed on the first surface, a lower wall formed on the second surface, and opposing first and second walls extending between the upper and lower walls,
wherein the molded plastic casing is formed such that said at least one passive component and said at least one IC device are encased by said thermoset plastic, and
wherein the molded plastic casing includes a pre-molded switch slot includes a cavity that is exposed by a first opening defined between first and second portions of said second side wall and a second opening defined in a portion of the lower wall; and a write protect switch assembly mounted onto the molded plastic casing, the write protect switch assembly including:
a movable switch button having a base portion movably engaged in the cavity of the pre-molded switch slot, and a button top extending through the first opening; and
a switch cap secured to the lower wall of the molded plastic casing and having a flat wall portion of the switch cap encloses the second opening such that the base portion of the movable switch button is covered by the flat wall portion.

2. The memory card device according to claim 1,
wherein the pre-molded switch slot further comprises two openings disposed at opposite ends of the cavity, and
wherein the write protect switch assembly further comprises a metal rod having ends respectively mounted in the two openings such that the metal rod extends across the cavity, and
wherein the movable switch button is slidably mounted on the metal rod such that the metal rod extends through a through-hole defined in the base portion.

3. The memory card device according to claim 2, wherein the two openings comprise slots defined in the molded plastic casing adjacent to the first and second portions of said second side wall, respectively.

4. The memory card device according to claim 1,
wherein the pre-molded switch slot further comprises a retention wall extending between the first and second portions of said second side wall, and
wherein the movable switch button further defines a retaining slot and is mounted on the molded plastic casing such that the retention wall is slidably received inside the retaining slot.

5. The memory card device according to claim 4, wherein the retention wall is slidably received inside the retaining slot such that the movable switch button is restricted by the retaining wall to move between the first and second portions of said second side wall.

6. The memory card device according to claim 1, wherein the pre-molded switch slot further comprises a positioning bump and the switch button is disposed on the molded plastic casing such that movement of the switch button between a "read only" position and "write allowed" position is restricted by the positioning bump.

7. The memory card device according to claim 1,
wherein the pre-molded switch slot further defines a support shelf disposed around an edge of said cavity, and a plurality of retention openings that extend downward into support shelf,
wherein the switch cap is mounted on the lower wall of the molded plastic casing such that the flat wall portion is disposed on the support shelf, and
wherein the switch cap further comprises a plurality of protrusions, each of the plurality of protrusions being inserted into an associated one of the plurality of retention openings.

8. The memory card device according to claim 7, wherein the switch cap comprises molded plastic and the plurality of protrusions comprise poles.

9. The memory card device according to claim 7, wherein the switch cap comprises metal and the plurality of protrusions comprise metal hooks.

10. The memory card device according to claim 1, wherein the movable switch button is mounted on the molded plastic casing such that the movable switch button is restricted to move in a direction perpendicular to the second side wall.

11. The memory card device according to claim 1, wherein said upper wall defines a plurality of openings disposed to expose said plurality of metal contacts, and wherein the molded plastic casing further includes a plurality of ribs, each rib being disposed between a corresponding adjacent pair of said openings.

12. The memory card device according to claim 1, wherein the at least one IC device comprises one or more unpackaged integrated circuit (IC) die that are wire bonded to said selected one of the first and second surfaces of the PCB.

13. The memory card device according to claim 12,
wherein said at least one passive component is surface mounted onto a first surface region and secured to first contact pads by solder, and
wherein said at least one unpackaged IC die includes:
a controller IC die mounted on a second surface region of said PCB and secured to second contact pads by first wire bonds, and
a first memory IC die mounted on a third surface region of said PCB and secured to third contact pads by second wire bonds.

14. The memory card device according to claim 13, wherein said at least one unpackaged IC die also includes a second memory IC die mounted on the first memory IC die and secured to the third contact pads by third wire bonds.

15. The memory card device according to claim 12,
wherein said plurality of metal contacts are formed directly on the first surface, and
wherein said at least one passive component and said at least one unpackaged IC die are mounted on said second surface and encased by said second wall of said molded plastic casing.

16. The memory card device according to claim 1, wherein the at least one IC device comprises one or more packaged integrated circuit (IC) die that are surface mounted to said selected one of the first and second surfaces the PCB by solder.

17. The memory card device according to claim 1, wherein the PCBA comprises a transfer molded core including a transfer mold casing formed over the at least one passive component and the at least one IC device.

18. The memory card device according to claim 17, wherein the transfer mold casing has a length that is approximately half of a length of the molded plastic casing.

19. The memory card device according to claim 1, further comprising a metal sheet disposed over the PCBA and secured to the molded plastic casing such that the metal sheet is disposed on an outside surface of the molded plastic casing.

20. The memory card device according to claim 1, wherein said memory card device comprises one of a SD device and a MMC device.

21. A method for producing a plurality of memory card devices, the method comprising:
producing a printed circuit board (PCB) panel including a plurality of PCB regions, each PCB region including a plurality of metal contacts disposed on an upper surface of said each PCB region;
attaching at least one passive component and at least one integrated circuit (IC) device to one of said upper surface and an opposing lower surface of each said PCB region;
mounting the PCB panel into a molding apparatus such that said upper surface of each said PCB region is disposed over a lower molding die and said metal contacts are pressed against raised supports;
forming a molded casing over at least one of the first surface and the second surface of each PCB region such that said at least one passive component and said at least one IC device of each PCB region are covered by thermal set plastic forming upper and lower walls of said molded casing, and such that the molded casing includes a pre-molded switch slot includes a cavity that is exposed by a first opening defined between first and second portions of a side wall of said molded casing, and a second opening defined in a portion of the lower wall;
singulating said PCB panel by cutting said PCB panel such that the PCB panel is separated into said plurality of memory card devices, wherein each memory card device includes a PCB region and a corresponding said molded casing; and mounting a write protect switch assembly onto the integral molded plastic casing, such that a movable switch button of the write protect switch assembly is mounted with a base portion movably engaged in the cavity of the pre-molded switch slot and a button top extending through the first opening, and a switch cap is secured to the lower wall of molded casing and has a flat wall portion of the switch cap enclosing the second opening such that the base portion of the movable switch button is covered by the flat wall portion.

* * * * *